(12) United States Patent
Okada et al.

(10) Patent No.: US 6,482,668 B2
(45) Date of Patent: *Nov. 19, 2002

(54) PROCESS FOR PRODUCING PHOTOVOLTAIC DEVICE

(75) Inventors: Naoto Okada, Nara; Masahiro Kanai, Kyoto; Hirokazu Ohtoshi; Tadashi Hori, both of Nara, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/260,044

(22) Filed: Mar. 2, 1999

(65) Prior Publication Data

US 2002/0037602 A1 Mar. 28, 2002

(30) Foreign Application Priority Data

Mar. 3, 1998 (JP) ............................................. 10-050282

(51) Int. Cl.$^7$ ................................................ H01L 21/00
(52) U.S. Cl. ............................................ 438/62; 118/718
(58) Field of Search ........................... 438/96, 97, 62; 136/258, 261; 427/578; 118/718

(56) References Cited

U.S. PATENT DOCUMENTS

| | | | |
|---|---|---|---|
| 2,949,498 A | 8/1960 | Jackson | 136/89 |
| 4,254,429 A | 3/1981 | Yamazaki | 357/16 |
| 4,377,723 A | 3/1983 | Dalal | 136/249 |
| 4,379,181 A * | 4/1983 | Cannella et al. | 427/39 |
| 4,400,409 A | 8/1983 | Izu et al. | 427/39 |
| 5,256,576 A * | 10/1993 | Guha et al. | 438/96 |

OTHER PUBLICATIONS

Y. Hattori et al., "High–Conductive Wide Band Gap P–Type a SiC:H Prepared By ECR CVD and Its Application To High Efficiency a–Si Basis Solar Cells", Nineteenth IEEE Photovoltaic Specialist Conference, pp. 689–694 (1987).

* cited by examiner

Primary Examiner—Olik Chaudhuri
Assistant Examiner—Douglas A. Wille
(74) Attorney, Agent, or Firm—Fitzpatrick, Cella, Harper & Scinto

(57) ABSTRACT

In the step of forming a microcrystalline i-type semiconductor layer by high-frequency plasma CVD, wherein an area of the parallel-plate electrode is represented by S; a width of the discharge space in its direction perpendicular to the transport direction of the belt-like substrate, by Ws; a width of a region formed by the parallel-plate electrode together with its surrounding insulating region, in its direction perpendicular to the transport direction of the belt-like substrate, by Wc; a width of the belt-like substrate in the direction perpendicular to its transport, by Wk; a distance between the parallel-plate electrode and the belt-like substrate, by h; a power density at which crystal fraction begins to saturate at predetermined substrate temperature, material gas flow rate and pressure, by Pd; and a high-frequency power, by P, $2h/(Ws-Wc) \geq 2.5$, $(Ws/h) \times 2(Ws-Wk)/[4h+(Ws-Wc)] \geq 10$, and $P \geq (10/8) \times Pd \times S$.

A microcrystalline semiconductor layer having lower characteristics distribution in the width direction of a belt-like substrate result, and photovoltaic devices having uniform photoelectric conversion efficiency can be mass-produced by a roll-to-roll system.

3 Claims, 14 Drawing Sheets

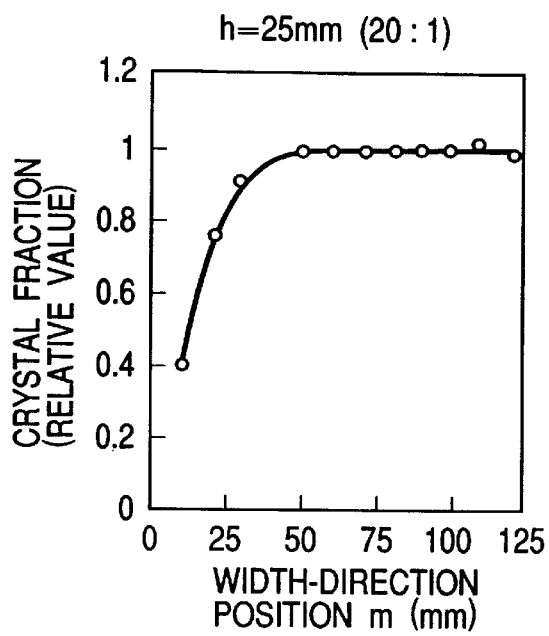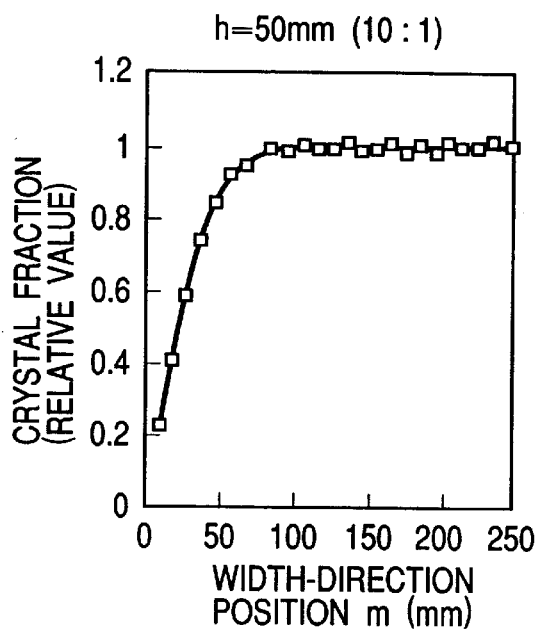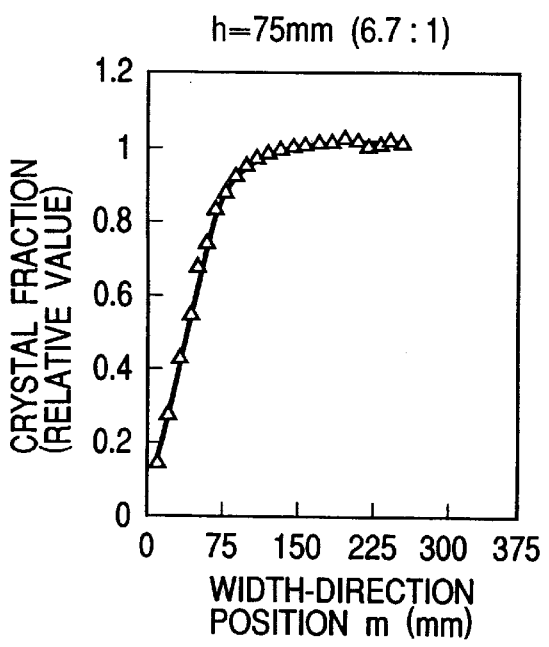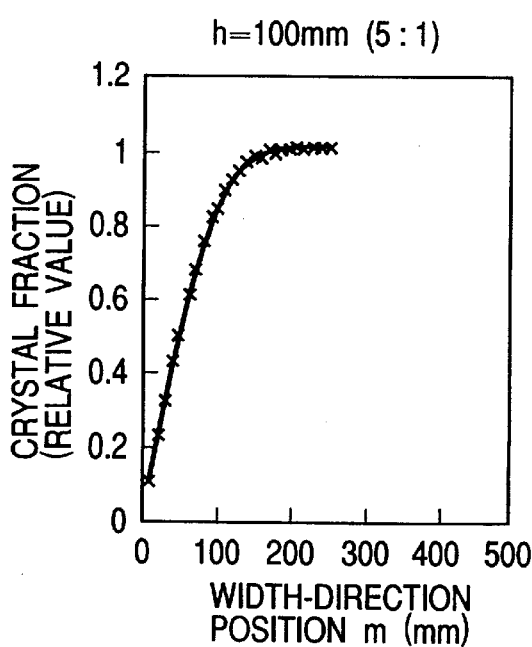

PROCESS FOR PRODUCING PHOTOVOLTAIC DEVICE

BACKGROUND OF THE INVENTION

1. Field of the Invention

This invention relates to a process for producing a non-single crystal semiconductor type photovoltaic device by a roll-to-roll system.

2. Related Background Art

Photovoltaic devices which are photoelectric conversion devices that convert sunlight into electric energy are put into wide use as public-purpose power sources for low-power supply such as in electronic calculators and wrist watches. Photovoltaic devices also attract notice as possible future substitute power generation means for petroleum fuel such as oil and coal. Photovoltaic devices utilize photovoltaic force attributable to, e.g., p-n junction of semiconductor devices. Semiconductors such as silicon absorb sunlight to produce photocarriers of electrons and holes by the aid of photon energy, and the photocarriers are taken out by differences in chemical potential at the p-n junction region.

In order to bring photovoltaic devices into practical use as electric power sources, it is important to achieve cost reduction and large-area devices, and various studies is conducted thereon. Researches are made on materials such as low-cost materials and materials with high photoelectric conversion efficiency. Such materials for photovoltaic devices may include tetrahedral type amorphous semiconductors such as amorphous silicon, amorphous silicon germanium and amorphous silicon carbide, and compound semiconductors of Groups II–VI such as CdS and $Cu_2S$ and those of Groups III–V such as GaAlAs. In particular, thin-film photovoltaic devices in which amorphous semiconductors are used in photovoltaic layers have advantages that they can provide films having larger area than single-crystal photovoltaic devices, can be formed in a small layer thickness and can be deposited on any desired substrate material; thus they are regarded as promising.

However, in order to put such amorphous semiconductor type photovoltaic devices into practical use as electric power sources, it has been a subject for study to improve photoelectric conversion efficiency and improve reliability.

As a means for improving the photoelectric conversion efficiency of the photovoltaic devices making use of amorphous semiconductors, various methods are available. For example, with regard to a photovoltaic device that utilizes a p-i-n type semiconductor junction, a p-type semiconductor layer, an i-type semiconductor layer, an n-type semiconductor layer, a transparent electrode and a back surface electrode which constitute the device must be improved in characteristics for each layer.

As another method for improving photoelectric conversion efficiency of photovoltaic devices, U.S. Pat. No. 2,949,498 discloses the use of what is called a stacked cell, in which photovoltaic devices having a certain unit device structure are superposed in plurality. This stacked cell makes use of p-n junction crystal semiconductors. Its concept is common to both amorphous and crystalline and is to make sunlight spectra absorb efficiently through photovoltaic devices having different band gaps and make open-circuit voltage (Voc) higher so that electricity generation efficiency can be improved.

In the stacked cell, constituent devices having different band gaps are superposed in plurality, and sunlight rays are absorbed efficiently at every part of their spectra so that photoelectric conversion efficiency can be improved. The cell is so designed that what is called the bottom layer positioned beneath what is called the top layer has a narrower band gap than the band gap of the top layer positioned on the light-incident side of the superposed constituent devices.

Meanwhile, Y. Hamakawa, H. Okamoto and Y. Nitta report what is called a cascade type cell, in which amorphous silicon layers having the same band gaps are superposed in multi-layer in such a way that no insulating layer is provided between photovoltaic devices so that the open-circuit voltage (Voc) of the whole device can be made higher. This is a method in which unit devices made of amorphous silicon materials having the same band gaps are superposed.

In the case of such stacked cells, too, like the case of single-layer cells (single cells), in order to improve photoelectric conversion efficiency, characteristics must be improved for each layer of the p-type semiconductor layer, i-type semiconductor layer, n-type semiconductor layer, transparent electrode and back electrode which constitute the photovoltaic device.

For example, in the case of the photoactivation layer, i-type semiconductor layer, it is very important to make band-gap internal levels (localized levels) as low as possible to improve transport performance of photocarriers.

With regard to what is called doped layers such as the p-type semiconductor layer and n-type semiconductor layer, it is first required that their activated acceptors or donors are in high density and can be activated at a small energy. This makes diffusion potential (built-in potential) large when a p-i-n type junction is formed and enhances the open-circuit voltage (Voc) of the photovoltaic device, bringing about an improvement in photoelectric conversion efficiency.

It is second required that the doped layers, which basically do not contribute to the generation of photocurrent, do not obstruct, as far as possible, the light entering the photocurrent-generating i-type semiconductor layer. Accordingly, in order to make the doped layers absorb less light, it is important to make their optical band gaps wide and to form them in small layer thickness.

Materials for doped layers having such characteristics include, e.g., Group IV semiconductor materials such as Si, SiC, SiN and SiO, and those having amorphous or microcrystalline form have been studied. In particular, Group IV semiconductor alloy materials having a wide optical band gap have been considered preferable because of their small absorption coefficient, and microcrystalline or polycrystalline semiconductor materials are preferred, because of their small absorption coefficient and small activation energy.

However, significant lowering of carrier transport performance and fill factor (FF) has occurred which is ascribable to lattice matching and junction interfacial levels between the i-type semiconductor layer and the microcrystalline or polycrystalline p-type semiconductor layer, and its improvement has been a subject for study.

Methods for solving such problems are under study. As an example thereof, U.S. Pat. Nos. 4,254,429 and No. 4,377,723 disclose a method in which what is called a buffer layer(s) is/are provided at the junction interface(s) between the p-type semiconductor layer and/or n-type semiconductor layer and the i-type semiconductor layer. At the junction interface between the p-type semiconductor layer or n-type semiconductor layer and the i-type semiconductor layer, the former being formed of amorphous silicon and the latter being formed of amorphous silicon germanium, many midgap levels are produced because of differences in lattice constant. Hence, they serve as the center of recombination at the junction interface to make the lifetime of carriers short. Such a buffer layer is formed so that by the use of the buffer layer the band-gap internal levels can be reduced and the carrier transport performance is not damaged, thereby bringing about an improvement in characteristics.

Now, as a process for producing photovoltaic devices by forming semiconductor functional deposited films continuously on a substrate, a process is known in which independent film-forming chambers for forming all kinds of semiconductor layers are provided. The respective film-forming chambers are connected through gate valves by a load-lock system, and the substrate is moved successively to the respective film-forming chambers to form thereon all kinds of semiconductors.

As a process which can improve mass productivity greatly, U.S. Pat. No. 4,400,409 discloses a continuous plasma CVD (chemical vapor deposition) process employing a roll-to-roll system. According to this process, a continuous belt-like substrate is used as a substrate, and the substrate is transported continuously in its lengthwise direction while depositing and forming semiconductor layers with any necessary conductivity types in a plurality of glow discharge regions to form continuously devices having semiconductor junctions.

A deposited film forming apparatus of the above roll-to-roll system is constituted of a belt-like substrate wind-off chamber and a wind-up chamber which are provided at both ends, respectively, and provided between them deposited-film-forming chambers for forming a plurality of semiconductor layers by plasma CVD, which are connected through gas gates. Into the gas gates, a scavenging gas such as $H_2$ gas is introduced to form pressure barriers against adjoining deposited-film-forming chambers so that the gas can be prevented from diffusing across the chambers. This is characteristic of the roll-to-roll system film-forming apparatus. Materials gases are fed to each deposited-film-forming chamber, and high-frequency or microwave power is applied thereto to cause discharge to take place in the discharge space. Each deposited-film-forming chamber also has an evacuation means and a pressure control valve so that its inside can be maintained at a vacuum state with a certain pressure.

In actual film formation, the continuous belt-like substrate is stretched over the wind-off chamber and the wind-up chamber, and semiconductor layers can be deposited and formed successively in the discharge spaces of the deposited-film-forming chambers while feeding and moving forward the substrate continuously.

In the roll-to-roll system, in view of its film-forming process, a film formed on the belt-like substrate has principally no difference in the transport direction of the belt-like substrate. In the width direction of the belt-like substrate, however, the film has a boundary condition at its edge areas which is quite different from its center area, especially when a high-frequency power is used as excitation energy and a parallel-plate electrode is used. This may cause a lowering of the density of excitation energy. Also, when a microcrystalline material is used in the buffer layer, a high feeding energy is required in order to form microcrystals, and hence a serious problem may occur with respect to the distribution of crystallinity in the width direction of the belt-like substrate. Such a difference in crystallinity brings about a difference in band gaps and activation energy of films, and hence may hinder the formation of desired junctions to bring about an increase in series resistance of the photovoltaic device, thereby resulting in a decrease in photoelectric conversion efficiency because of a lowering of the fill factor.

SUMMARY OF THE INVENTION

An object of the present invention is to provide, in such a roll-to-roll system, a process for producing a photovoltaic device having a uniform photoelectric conversion efficiency, which is attributable to the formation of a microcrystalline semiconductor layer having lower characteristics distribution in the width direction of a belt-like substrate.

The present invention provides a process for producing a photovoltaic device, comprising the step of forming a semiconductor layer comprising a non-single crystal first-conductivity type semiconductor layer, an amorphous i-type semiconductor layer, a microcrystalline i-type semiconductor layer and a microcrystalline second-conductivity type semiconductor layer, on a belt-like substrate while transporting the belt-like substrate continuously in its lengthwise direction;

depositing a microcrystalline i-type semiconductor layer being accomplished by introducing a film-forming gas into a discharge space one face of which is formed by the belt-like substrate and simultaneously applying a high-frequency power from a parallel-plate electrode facing the belt-like substrate, to cause plasma in the discharge space to form a deposited film continuously on the surface of the belt-like substrate;

wherein an area of the parallel-plate electrode is represented by S; a width of the discharge space in its direction perpendicular to the transport direction of the belt-like substrate, by Ws; a width of a region formed by the parallel-plate electrode together with its surrounding insulating region, in its direction perpendicular to the transport direction of the belt-like substrate, by Wc; a width of the belt-like substrate in the direction perpendicular to its transport, by Wk; a distance between the parallel-plate electrode and the belt-like substrate, by h; a power density at which a crystal fraction begins to saturate at predetermined substrate temperature, material gas flow rate and pressure, by Pd; and the high-frequency power, by P; and wherein $2h/(Ws-Wc) \geq 2.5$, $(Ws/h) \times 2(Ws-Wk)/[4h+(Ws-Wc)] \geq 10$, and
$P \geq (10/8) \times Pd \times S$.

In a preferred embodiment of the present invention, a value of Wc/h is 10 or more. Also, the belt-like substrate used in the present invention may preferably be electrically conductive.

BRIEF DESCRIPTION OF THE DRAWINGS

FIGS. 6A, 6B, 6C and 6D show graphs given by converting the abscissa in the FIG. 5 graph in accordance with discharge space length-width ratio Ws/h.

DESCRIPTION OF THE PREFERRED EMBODIMENTS

The present invention is characterized in that, in the step of depositing a microcrystalline i-type semiconductor layer according to the roll-to-roll system, the shape of a discharge space, the width of a belt-like substrate and conditions such as the distance of these are set to have a predetermined relation. The relationship according to the present invention will be described below.

As stated previously, the distribution of crystallinity in the buffer layer is concerned greatly with non-uniformity of characteristics of the photovoltaic device. Accordingly, first, an experiment was made in order to examine changes in distribution of crystallinity in accordance with conditions for the formation of buffer layer single films.

Figure 1:
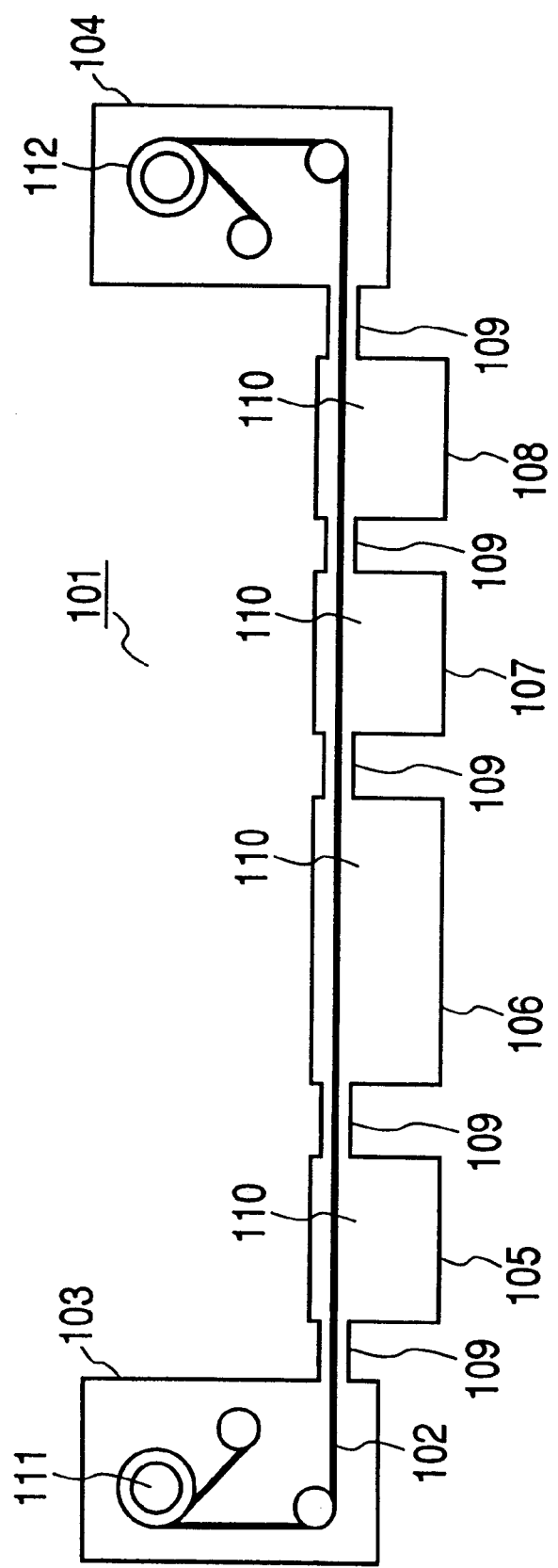
FIG. 1 is a schematic cross-sectional view of a plasma CVD single-cell continuous film-forming apparatus of a roll-to-roll system.

In this experiment, when semiconductor layers are formed, a plasma CVD single-cell continuous film-forming apparatus 101 of a roll-to-roll system as shown in FIG. 1 was used and Si single cells were produced.

In FIG. 1, reference numeral 102 denotes a continuous belt-like substrate; 103, a wind-off chamber for the belt-like substrate 102; 104, a wind-up chamber for the belt-like substrate 102; and 105 to 108, semiconductor-layer-forming chambers, and more specifically, 105, for forming an amorphous n-type Si layer which is a non-single crystal first-conductivity type semiconductor layer; 106, for forming an amorphous i-type Si layer; 107, for forming a microcrystalline i-type Si layer; and 108, for forming a microcrystalline p-type Si layer which is a microcrystalline second-conductivity type semiconductor layer. Reference numeral 110 denotes discharge spaces; 109, gas gates; and 111 and 112, bobbins.

Figure 2:
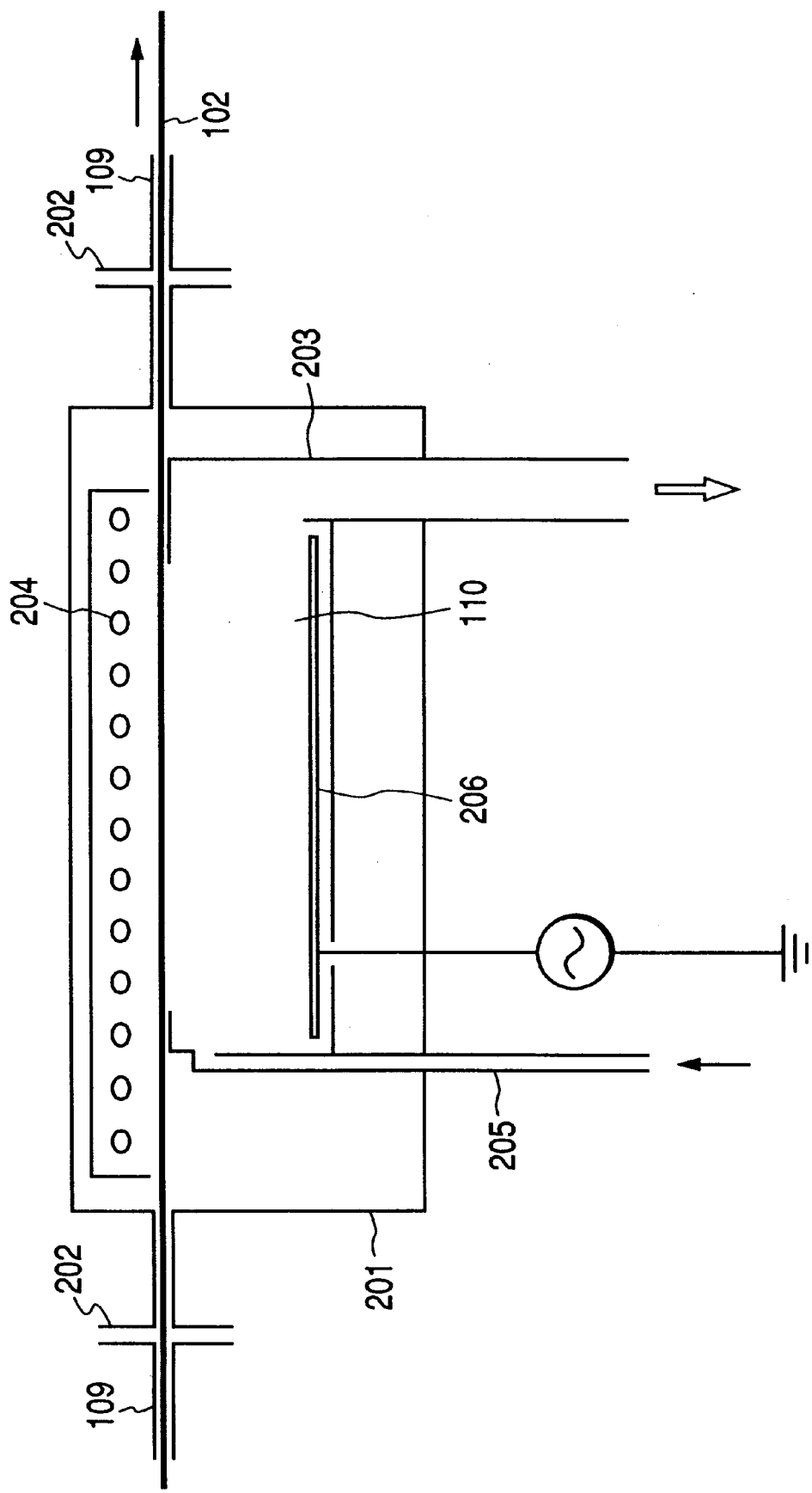
FIG. 2 is a schematic cross-sectional view of a high-frequency plasma CVD film-forming chamber for forming the microcrystalline i-type semiconductor layer according to the present invention, as its cross section parallel to the transport direction of the belt-like substrate.
Figure 3:
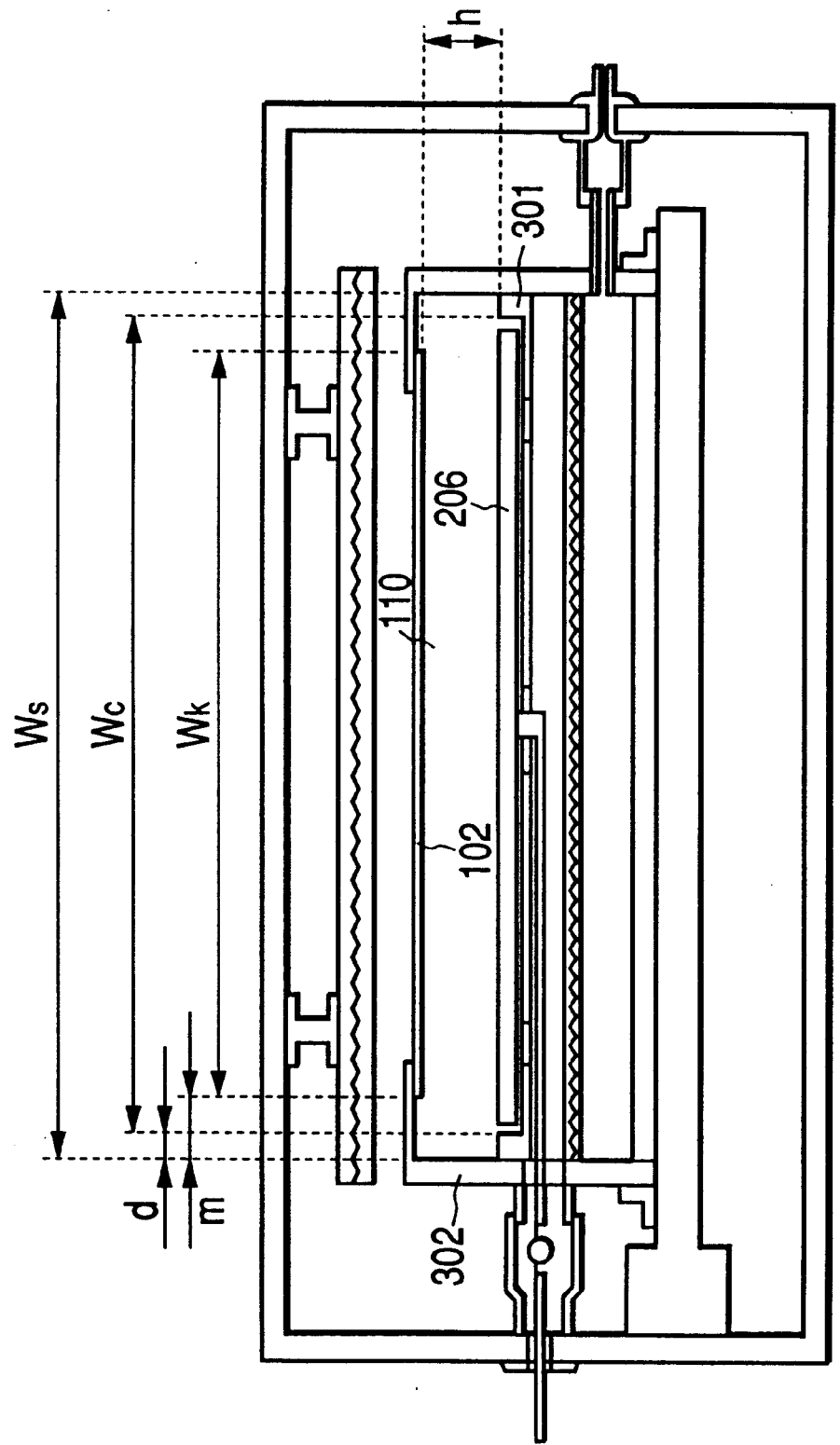
FIG. 3 is a schematic cross-sectional view of a high-frequency plasma CVD film-forming chamber for forming the microcrystalline i-type semiconductor layer according to the present invention, as its cross section perpendicular to the transport direction of the belt-like substrate.

FIG. 2 is a structural cross-sectional view of the semiconductor-film-forming chamber 106 for forming a microcrystalline i-type Si layer, shown in FIG. 1, as its cross-section parallel to the transport direction of the belt-like substrate. FIG. 3 shows its structural cross-section perpendicular to the transport direction. In FIGS. 2 and 3, reference numeral 201 denotes a vacuum chamber; 102, a belt-like substrate; 109, gas gates; 202, gate gas feed means; 203, a discharge box; 204, a belt-like substrate heating means (a lamp heater); 205, material gas feed means; 206, a high-frequency parallel-plate electrode (a cathode electrode); 110, a discharge space; 301, a discharge box bottom plate; and 302, a discharge box side plate.

Material gases are introduced into the discharge space 110 through the material gas feed means 205. Then, a high-frequency power is applied through the parallel-plate electrode 206 to decompose and excite the material gases and cause the generation of plasma. The belt-like substrate 102 is heated and kept at a prescribed temperature by means of the lamp heater 204. Thus, a functional deposited film can be formed continuously and in a large area.

In the present invention, as shown in FIG. 3, in the direction perpendicular to the transport direction of the belt-like substrate 102, a width of the discharge space 110 is represented by Ws; a width of a region formed by the parallel-plate electrode 206 together with its surrounding insulating region, by Wc; a width of the belt-like substrate 102, by Wk; and a distance between the parallel-plate electrode 206 and the belt-like substrate 102, by h. To simplify the description, an edge area width d of the discharge box bottom plate is introduced by the following-expression:

$$d=(Ws-Wc)/2.$$

As a distance from one width-direction end of the discharge space at an arbitrary position on the belt-like substrate 102, a width-direction position m is also introduced (indicated in FIG. 3 is the distance to the far edge of the belt-like substrate 102).

Crystallinity of microcrystalline film, i.e., the crystal fraction that indicates a ratio of amorphous component to crystalline component is measured by spectral elipsometry. The spectral elipsometry is a process by which a difference in absorptivity of light waves perpendicular to light waves parallel to the film surface is measured and their absorption to a film formed on a non-light-transmitting substrate such as a metal substrate can be measured by utilizing reflection. In the spectral elipsometry, the dispersion of light waves is measured, whereby the ratio of amorphous component to crystalline component can be calculated from their waveform separation.

Experiment 1

First, changes in distribution in accordance with the shape of edge areas of the discharge box were examined. The size of d was changed in order to change the shape of ends of the discharge box. The discharge box bottom plate 301 and the parallel-plate electrode 206 were changed in size to change the d to 5, 10, 20 or 40 mm. The distance of the-insulating region (the width of a space between an edge of the discharge box bottom plate 301 and an edge of the parallel-plate electrode 206) was fixed at 5 mm. As for each shape, films were formed under conditions shown in FIG. 1.

Belt-like substrate: SUS430

Wk=480 mm, Ws=500 mm, h=50 mm

TABLE 1

| Gases used | Flow rate (sccm) | High-frequency power (W) | Pressure (Torr) | Substrate temperature (° C.) |
|---|---|---|---|---|
| $SiH_4$ | 30 | 1,000 | 1.05 | 210 |
| $H_2$ | 1,500 | | | |

In each d of the above, crystal fractions at width-direction positions m=20, 40, 60, 80, 100 mm and 250 mm (the center area) were measured.

Figure 4:
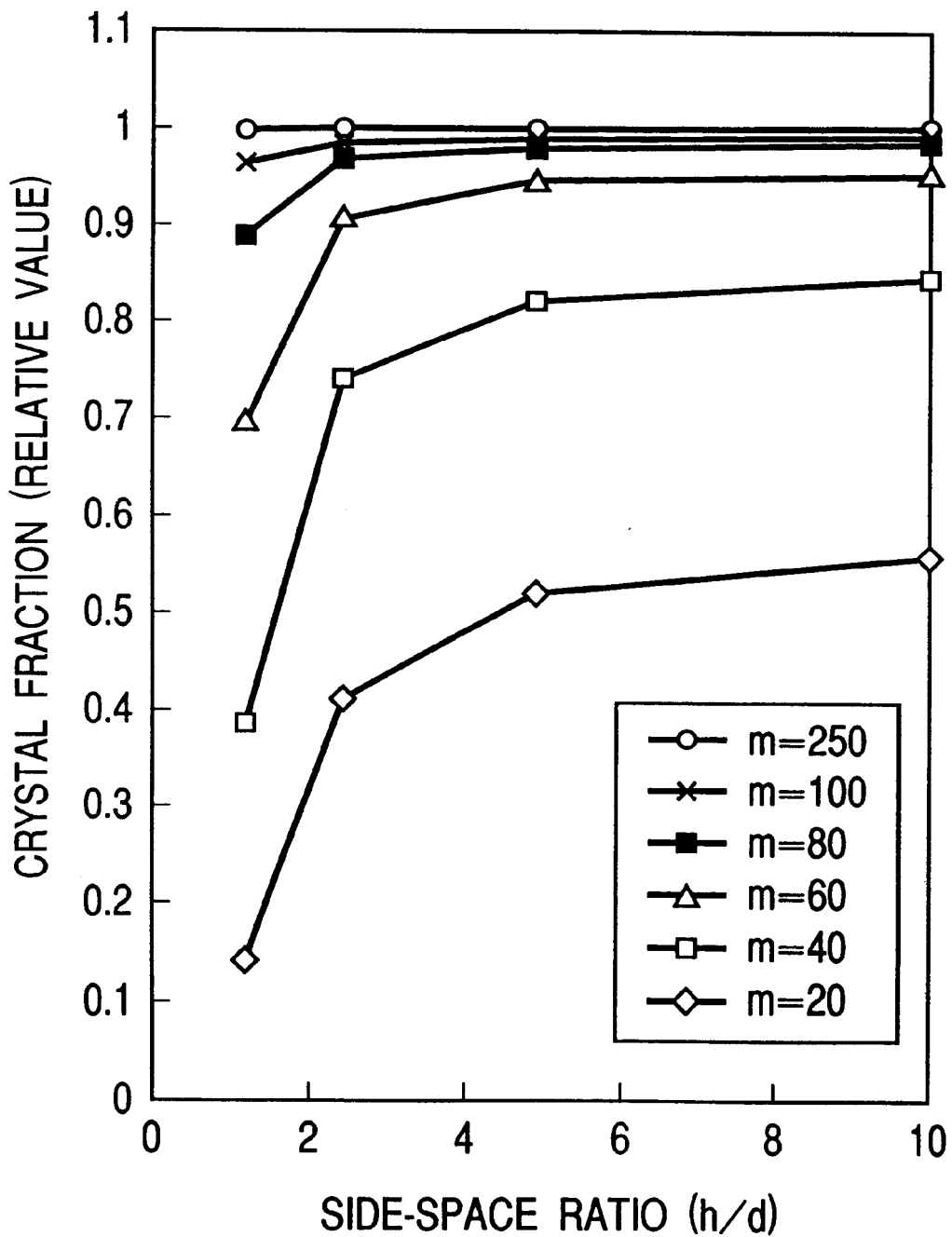
FIG. 4 is a graph showing the relationship between side-space ratio h/d and crystal fraction (relative value) at different positions of position m in width direction at the time of formation of the microcrystalline i-type semiconductor layer according to the present invention.

Results obtained are plotted with the values of h/d as abscissa for the value of m as a parameter, which are as shown in FIG. 4. The numbers of the ordinate indicated ratios to the crystal fraction at m=250 mm (the center area) which was regarded as 1. As can be seen from FIG. 4, the crystal fraction (relative value) at the respective positions increases with an increase in h/d. The crystal fraction increases greatly until h/d=2.5 and is seen to increase no longer when h/d=5 or more. This means that a good crystallinity with less distribution can be attained at each width-direction position by maintaining at 2.5 or more h/d which represents the shape at sides of the discharge space.

Experiment 2

Next, the influences of changes in length-width ratio Ws/h of the discharge space was examined. The value of h was changed by changing the discharge box side plate 302, to change the value of Ws/h. Films were formed under the same conditions as in Experiment 1 except for those shown in Table 2. In the present experiment, only the value of h was changed while the value of Ws was fixed, and hence the capacity of the discharge space changed in proportion to h. In each condition, the pressure was fixed, and in order to make the residence time even, the flow rate of the used gas was made proportional to h and the high frequency power was also made proportional to h. On the basis of the results of Experiment 1, the value of d was also changed so that the h/d became constant at 2.5.

Belt-like substrate: SUS4302D

Wk=480 mm, Ws=500 mm, h=25 to 100 mm

S=850 mm×450 mm

TABLE 2

| h (mm) | Gases used | Flow rate (sccm) | High-frequency power (W) | Pressure (Torr) | Substrate temp. (° C.) |
|---|---|---|---|---|---|
| 25 | $SiH_4$ | 15 | 500 | 1.05 | 210 |
| | $H_2$ | 750 | | | |
| 50 | $SiH_4$ | 30 | 1,000 | 1.05 | 210 |
| | $H_2$ | 1,500 | | | |
| 75 | $SiH_4$ | 45 | 1,500 | 1.05 | 210 |
| | $H_2$ | 2,250 | | | |

TABLE 2-continued

| h (mm) | Gases used | Flow rate (sccm) | High-frequency power (W) | Pressure (Torr) | Substrate temp. (° C.) |
|---|---|---|---|---|---|
| 100 | $SiH_4$ | 60 | 2,000 | 1.05 | 210 |
| | $H_2$ | 3,000 | | | |

Figure 5:
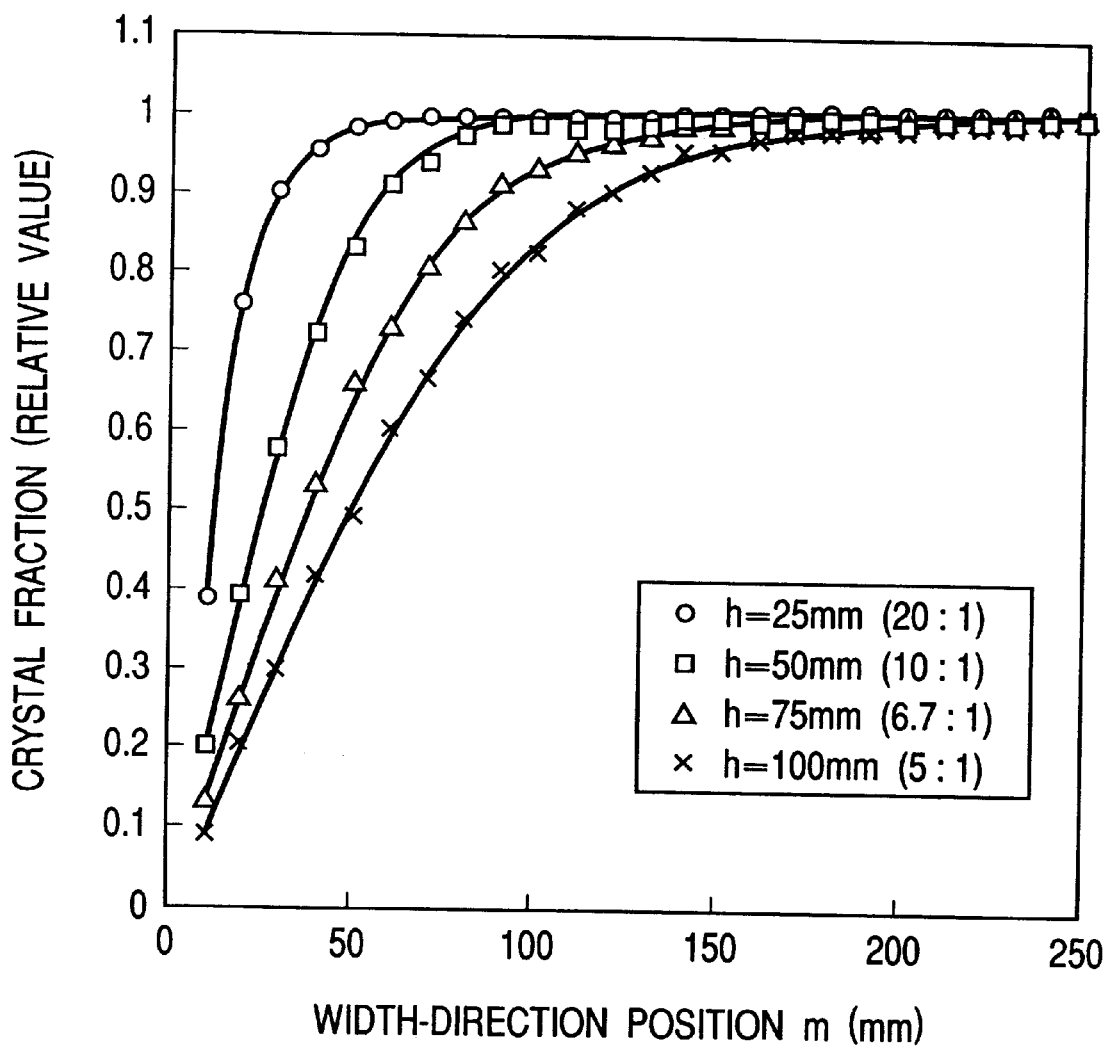
FIG. 5 is a graph showing the relationship between parallel-plate electrode to belt-like substrate distance h and crystal fraction (relative value) at different positions of position m in width direction at the time of formation of the microcrystalline i-type semiconductor layer according to the present invention.

For each h, the distribution of crystal fraction in the width direction was plotted to obtain the results shown in FIG. 5.

As can be seen from FIG. 5, the crystal fraction becomes more non-uniform with an increase in the h, i.e., with a decrease in the length-width ratio Ws/h.

In order to clarify the influence of this length-width ratio, the length indicated on the abscissa was converted to obtain the results shown in FIG. 6. Those shown in FIG. 6 are revisions made by regarding the length on the abscissa at the time of h=50 mm and Ws/h=10 as 1, the length on the abscissa at the time of Ws/h=20 as 2, and the length on the abscissa at the time of Ws/h=5 as ½.

As can be seen from FIG. 6, in the respective length-width ratios, the graphs are substantially identical in shape.

The above results also lead to the following conclusions. Considering length-width ratio Ws/h=10, the crystal fraction at the width-direction position m=50 mm can be said in a different way that, at Ws/h=20, it is identical to the crystal fraction at m=25 mm which is the position half the m=50, and the crystal fraction at Ws/h=5 is identical to the crystal fraction at m=100 mm which is the position twice the m=50. More specifically, on the basis of the length-width ratio Ws/h=10, when the length-width ratio is changed, a width direction m' that provides the same crystal fraction as that at the position of the width-direction position m at the length-width ratio=10 is seen to be m'=m×10/(Ws/h).

Using this relationship, the width-direction position standing when the length-width ratio is changed can be converted, thus the length-width ratio Ws/h=10 is regarded as a basis.

Next, approximately what position was preferable for each edge area of the belt-like substrate (its approximate distance from the discharge box side plate 302) was examined. What is shown in FIG. 4 in Experiment 1 has led to a conclusion that the crystal fraction increases with an increase in h/d and shows no changes at a certain value or above. Accordingly, taking note of the distribution of crystal fraction at various values of h/d, a width-direction position $m_1$ that provides a crystal fraction of 90% or more of that at the center area is seen to be 50 mm or more. Here, even if only the Ws is extended to the width direction, it is believed that only the part where the distribution is uniform at the center area becomes larger and no change occurs in the distribution at edge areas. Hence, it can be said that $m_1$ depends on h. In Experiment 1, the h is 50 mm, and hence it can be said that, at a width-direction position m larger than h (m>h), a sufficiently large value of h/d provides a crystal fraction of 90% or more of that at the center area.

However, since the crystal fraction becomes more non-uniform with a decrease in the value of h/d, the crystal fraction of 90% or more of that at the center area can not be attained if only the condition of m>h is fulfilled. To examine the relation of this deviation, in FIG. 5 which is a graph of h/d=2.5 (constant), a width-direction position $m_o$ that provides the crystal fraction of 90% or more of that at the center area was read from the plotted data (closest values were employed because actually the plotted data were discontinuous), and the relationship between the value obtained by subtracting the value of each h therefrom ($m_0$–h) and the value of d was plotted to obtain the results shown in FIG. 7.

Figure 7:
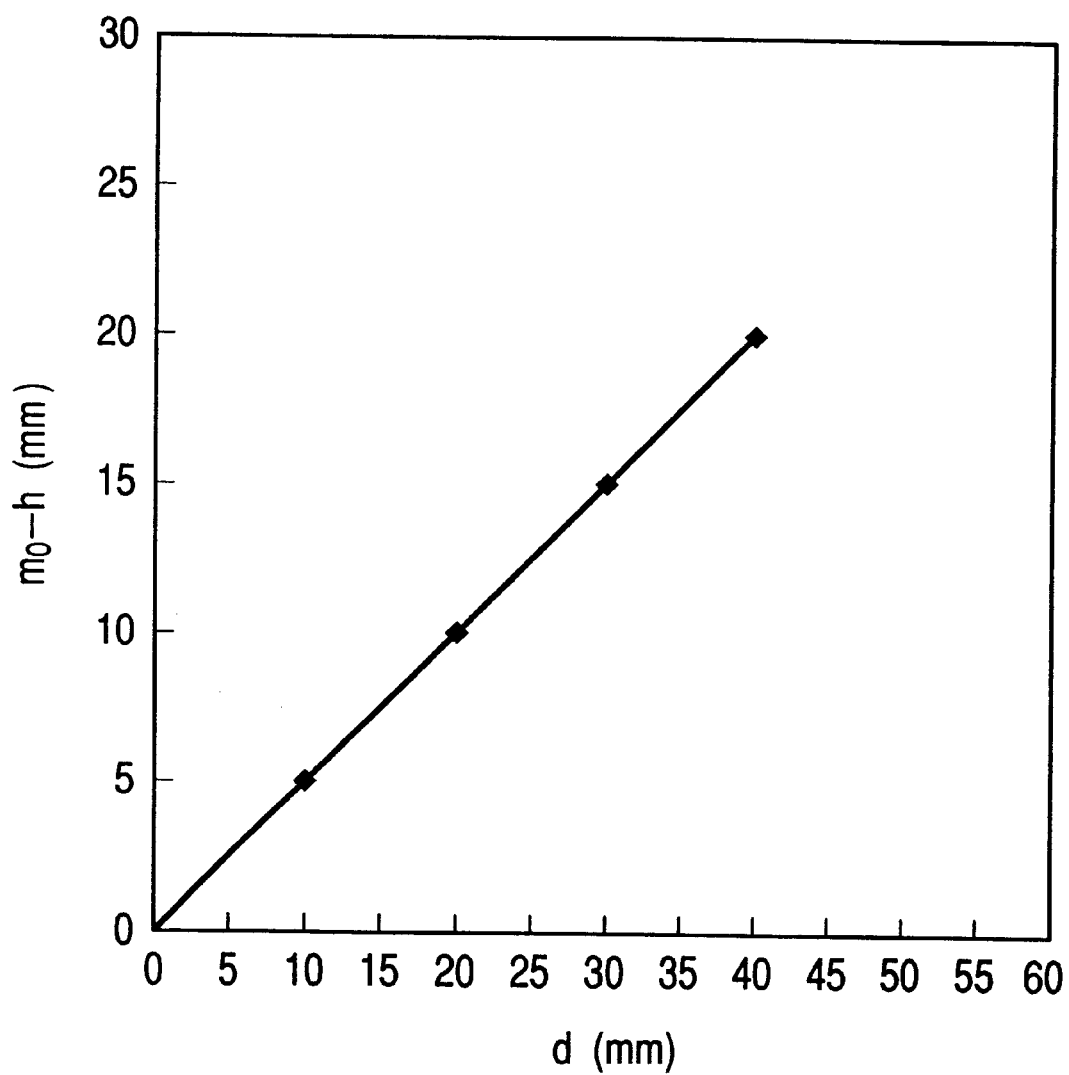
FIG. 7 is a graph given from the FIG. 5 graph by plotting the relationship between i) the value obtained by subtracting h from width-direction position $m_o$ that provides a crystal fraction of 90% or more of that at the center area and ii) d.

As can be seen from FIG. 7, a good proportional relation is shown, and its slope is substantially ½. That is, $m_0$=h+(d/2).

As can be seen from the foregoing, the crystal fraction of 90% or more of that at the center area is attained at a width-direction position m that satisfies m≧h+(d/2), so long as the value of h/d is 2.5 or more. More specifically, a position $m_e$ at an edge area of the belt-like substrate 102 may be so set as to be $m_e$≧h+(d/2), whereby the crystal fraction can be prevented from distributing. Also, as shown previously, the width direction m is regarded on the basis of Ws/h=10. Thus, taking account of these, the following expression is attained:

$$m_e=(Ws-Wk)/2 \geq [10/(Ws/h)] \times [h+(d/2)],$$

Therefore, $$(Ws/h) \times 2(Ws-Wk)/[4h+(Ws-Wc)] \geq 10.$$

Hence, the values of the chamber may be set as shown by the above expression and also the value of h/d, i.e., 2H/(Ws–Wc), may be set to be 2.5 or more. This enables deposition of a microcrystalline i-type semiconductor layer having a uniform distribution of crystallinity.

Experiment 3

Even under the conditions described above, areas with a slightly low crystallinity are present at edge areas with respect to the center area. Such areas with a low crystallinity affect the formation of junctions greatly, and cause, as a phenomenon, an increase in series resistance among characteristics of the photovoltaic device, to cause a lowering of fill factors, resulting in a great lowering of conversion efficiency. The present invention has also solved such a problem.

The present inventors produced Si single cells at various applied high-frequency powers to examine changes in semiconductor at the center area and edge areas. To produce the Si single cells, the film-forming chamber used in Experiment 1 was used. The specific production procedure was as described below.

First, in the wind-off chamber 103 having a substrate delivering mechanism, a bobbin 111 was set which was wound with a belt-like substrate 102 (356 mm wide×200 m long×0.15 mm thick) comprised of SUS4302D, having been degreased and cleaned thoroughly and on which, as a lower electrode, an aluminum thin film 200 nm thick and a ZnO thin film 1.2 μm thick had been deposited by sputtering. This belt-like substrate 102 was passed through the gas gate 109 and the deposited-film-forming chambers 105 to 108 until it was wound around the bobbin 112 in the wind-up chamber 104 having a belt-like substrate wind-up mechanism, where its tension was adjusted-so as to be substantially free from sag.

In this state, the chambers 103, 105 to 108 and 104 were evacuated to $1 \times 10^{-1}$ Torr or below by means of a vacuum pump (not shown).

Next, $H_2$ as a gate gas was flowed at a rate of 1,000 sccm for each chamber through a gate gas feed pipe (not shown), and the belt-like substrate 102 was heated by the lamp heater. Then, material gases were fed into the discharge space of each deposited-film-forming chamber through a material gas feed means. Conductance of a conductance valve (not shown) provided in a chamber (not shown) was so adjusted that the pressure in each chamber was set to a prescribed value. Thereafter, a prescribed high-frequency (13.56 MHz) power was applied to the cathode electrode of each deposited-film-forming chamber to cause discharge to take place in the discharge space.

Next, the belt-like substrate 102 was wound off continuously from the wind-off chamber 103, and a first-conductivity type semiconductor layer, n-type Si layer, an amorphous i-type Si layer, microcrystalline i-type Si layer and a second-conductivity type semiconductor layer, microcrystalline p-type Si layer were superposed by forming them continuously on the belt-like substrate 102, which was then wound up on the bobbin 112 of the wind-up chamber 104 having a belt-like substrate wind-up mechanism.

Next, on the microcrystalline p-type Si layer, ITO ($In_2O_3$+$SnO_2$) as a transparent conductive layer was deposited in a thickness of 68 nm by sputtering using a different apparatus, and Al as a collector electrode was further deposited in a thickness of 2 μm by vacuum deposition. Thus photovoltaic devices were produced.

When the photovoltaic devices were produced, the high-frequency power applied for forming the microcrystalline i-type Si layer was changed, and the characteristics of the photovoltaic devices obtained were compared. Other fabrication conditions (materials gases used, RF power, pressure and substrate temperature) for forming the semiconductor layers of the photovoltaic devices were as shown in Table 3. Ws=500 mm, h=50 mm, d=20 mm, S=850 mm×450 mm (each value is so set as to satisfy the results of Experiment 2

Belt-like substrate: SUS4302D, Wk=356 mm, thickness: 0.15 mm

Reflecting layer: Al thin film, thickness: 200 nm

Reflection enhancing layer: ZnO thin film, thickness: 1.2 μm

Transparent conductive layer: ITO thin film, thickness: 68 nm

TABLE 3

| Layer: Layer thickness (Å) | Gases used | Flow rate (sccm) | High-frequency power (W) | Pressure (Torr) | Substrate temp. (° C.) |
|---|---|---|---|---|---|
| Amorphous n-type Si layer: | | | | | |
| 125 | $SiH_4$ | 160 | 160 | 1.00 | 250 |
| | $PH_3/H_2$ ($PH_3$: 2%) | 240 | | | |
| | $H_2$ | 3,000 | | | |
| Amorphous i-type Si layer: | | | | | |
| 1,100 | $SiH_4$ | 350 | 1,400 | 1.10 | 200 |
| | $H_2$ | 6,000 | | | |
| Microcrystalline i-type Si layer: | | | | | |
| 60 | $SiH_4$ | 30 | 600 to 1,200 | 1.05 | 210 |
| | $H_2$ | 1,500 | | | |
| Microcrystalline p-type Si layer: | | | | | |
| 80 | $SiH_4$ | 15 | 1,500 | 1.00 | 170 |
| | $BF_3/H_2$ ($BF_3$: 2%) | 110 | | | |
| | $H_2$ | 5,000 | | | |

Samples were cut out at two places, the center area and an edge area. The respective positions were width-direction position m=250 at the center area and m=85 mm at the edge area.

Figure 8:
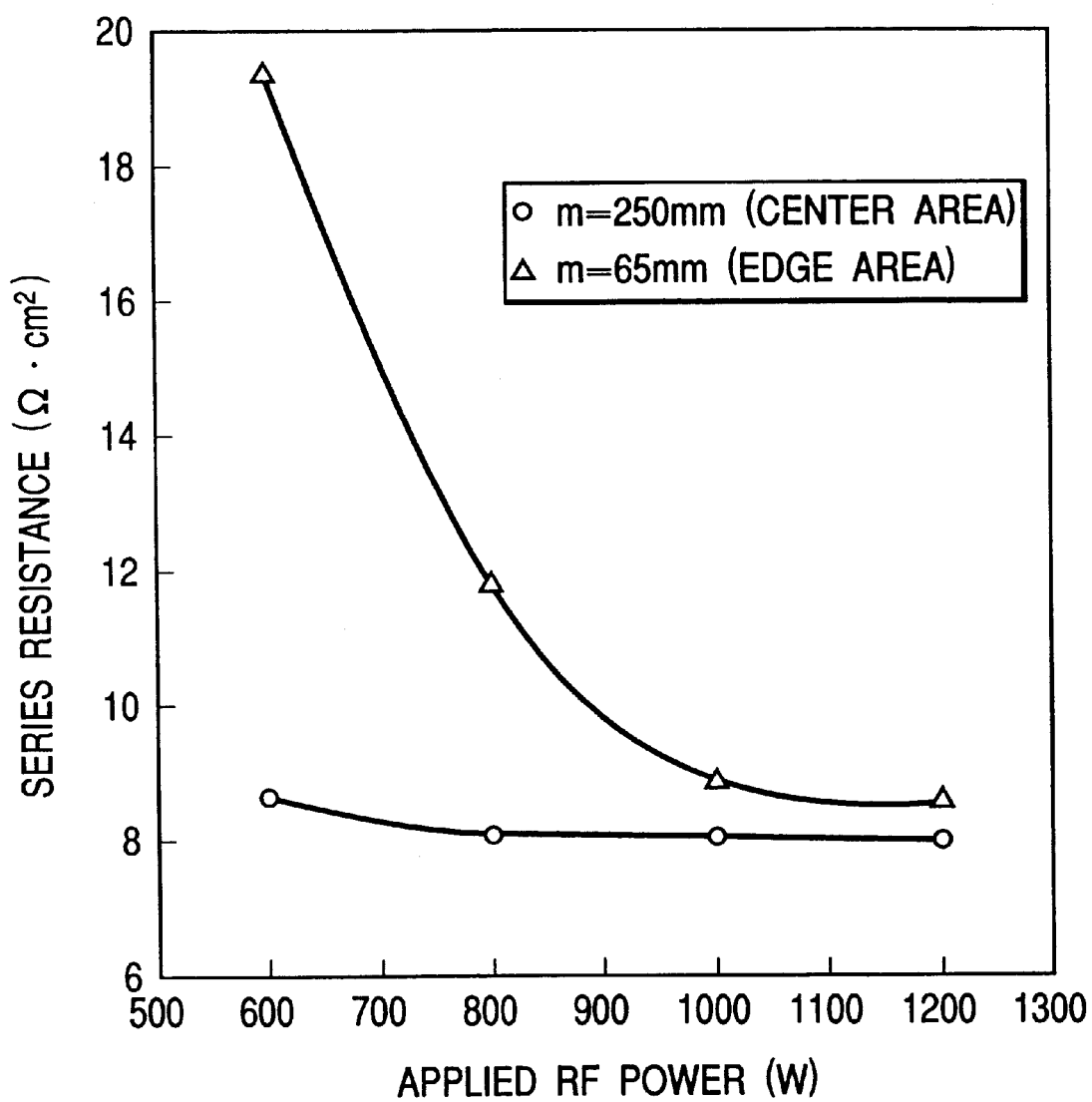
FIG. 8 is a graph showing changes in series resistance when in a Si single-cell type photovoltaic device a high-frequency power for forming a microcrystalline i-type Si layer is changed.

With regard to the above photovoltaic devices, the dependence of their series resistance on applied high-frequency (RF) power is shown in FIG. 8. The series resistance is a property by which the quality of performance of a photovoltaic device as a diode comes out remarkably and shows a low value when a good junction is formed. This series resistance is always affected by the bulk film characteristics or layer thickness of each semiconductor layer of the photovoltaic device. The series resistance of the photovoltaic device reflects remarkably the crystallinity of the microcrystalline i-type layer which is a buffer layer in the present Experiment.

As can be seen from FIG. 8, at an applied RF power of from 1,200 W to 800 W, the series resistance at the center area changes little and is almost constant, but, at an applied RF power further lowered to 600 W, the series resistance increases though slightly. This is caused by the fact that, at applied RF power of from 600 W to 800 W, the crystallinity increases with an increase in the applied RF power under such conditions, but the crystallinity becomes saturated at an applied RF power of 800 W or above. Here, considering the applied RF power at the center area, the discharge space has the constitution of an ideal parallel-plate electrode at its center area. Thus, an applied RF power density Pd may be regarded as a value obtained by dividing an applied RF power calculated geometrically by a parallel-plate electrode area S. More specifically, at the substrate temperature, material gas flow rate and pressure in the present Experiment, the crystal fraction saturates at an applied RF power density Pd=800 W/(450 mm×850 mm).

Next, with regard to the series resistance of the photovoltaic device at its edge area of m=85 mm, it shows a much higher series resistance than that at the center area, when the applied RF power is 600 W. This is caused by a low crystal fraction and an insufficient layer thickness which come from the fact that a lowering of electric-field density due to the disorder of electric lines of force at an electrode edge area makes the applied RF power lower at the substrate edge area than the applied RF power density calculated geometrically. However, the series resistance is seen to decrease greatly with an increase in the applied RF power. It decreases to substantially the same value as the series resistance at the center area when the applied RF power is 1,000 W or above which-is 10/8 time the 800 W at which the crystal fraction saturates at the substrate temperature, material gas flow rate and pressure in the present Experiment. More specifically, the applied RF power may be so set as to provide an RF power density of 10/8 or more of the applied RF power density Pd at which the crystal fraction saturates at predetermined substrate temperature, material gas flow rate and pressure, i.e., $P \geq (10/8) \times Pd \times S$, whereby the crystal fraction at the substrate edge area can be prevented dramatically from lowering, so that a photovoltaic device having very uniform characteristics can be provided.

EXAMPLE 1

Figure 9:
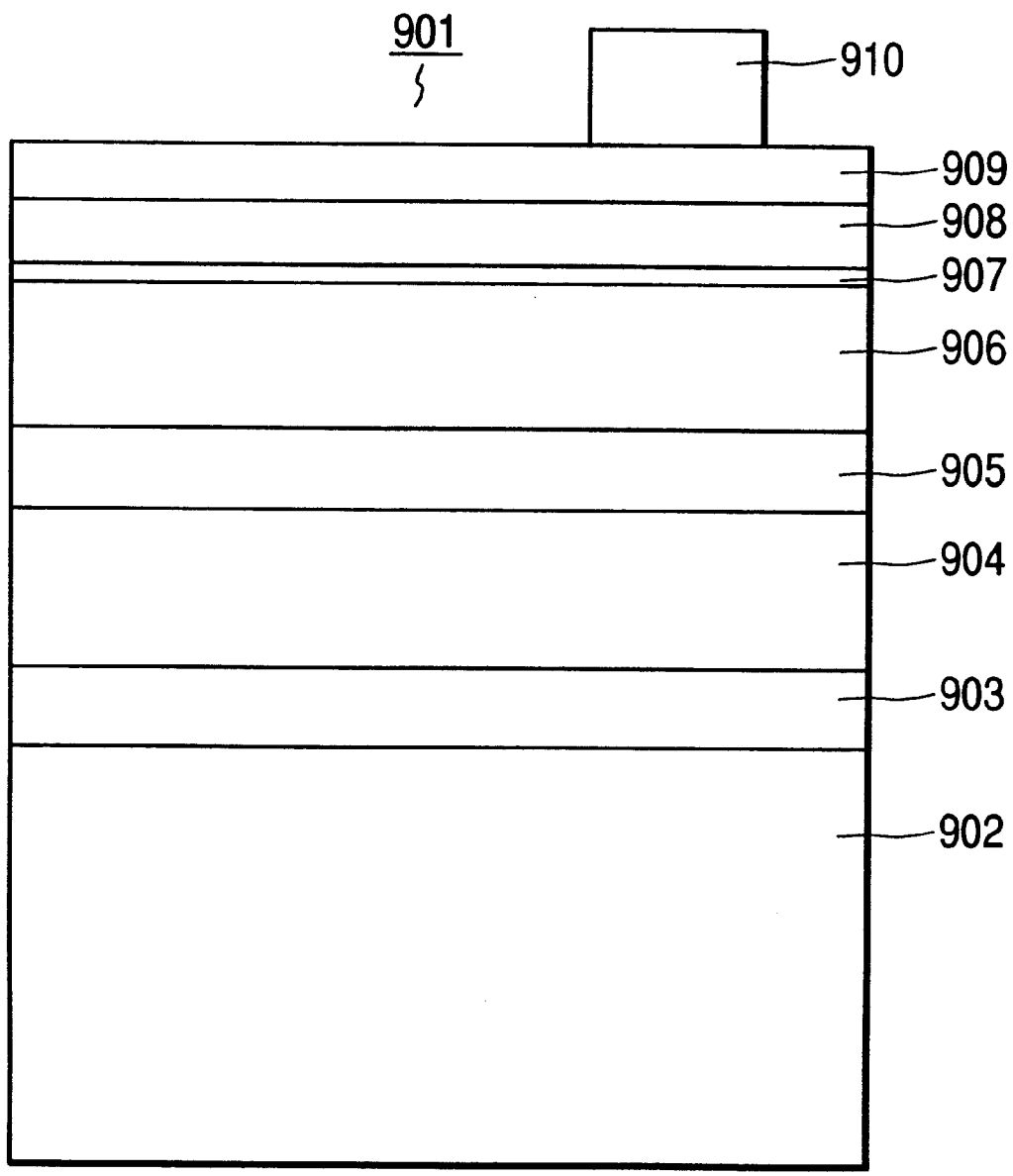
FIG. 9 is a diagrammatic cross-sectional view of the layer configuration of a Si single-cell type photovoltaic device of Example 1 in the present invention.

As Example 1, a Si single-cell type photovoltaic device 901 having the layer configuration as shown in FIG. 9 was produced. The photovoltaic device 901 was constituted of a conductive belt-like substrate 902 and formed superposingly thereon a back surface reflecting layer 903, a reflection enhancing layer 904, an amorphous n-type Si layer 905, an amorphous i-type Si layer 906, a microcrystalline i-type Si layer 907, a microcrystalline p-type Si layer 908, a transparent conductive layer 909 and a collector electrode 910.

To form the semiconductor layers, following the present invention, the plasma CVD single-cell continuous film-forming apparatus shown in FIG. 1 was used. A specific production procedure is described below.

First, in the wind-off chamber 103 having a substrate delivering mechanism, a bobbin 111 was set which was wound with a belt-like substrate 102 (356 mm wide×200 m long×0.15 mm thick) comprised of SUS4302D, having been degreased and cleaned thoroughly and on which an aluminum thin film 200 nm thick as the back surface reflecting layer 903 and a ZnO thin film 1.2 μm thick as the reflection enhancing layer 904 had been deposited by sputtering. This belt-like substrate 102 was passed through the gas gate 109 and the deposited-film-forming chambers 105, 106, 107 and 108 until it was wound around the bobbin 112 in the wind-up chamber 104 having a belt-like substrate wind-up mechanism, where its tension was adjusted so as to be substantially free from sag.

In this state, the chambers 103, 105, 106, 107, 108 and 104 were evacuated to $1 \times 10^{-1}$ Torr or below by means of a vacuum pump (not shown).

Next, $H_2$ as a gate gas was flowed at a rate of 1,000 sccm for each chamber through a gate gas feed pipe (not shown), and the belt-like substrate 102 was heated by the lamp heater so as to have the substrate temperature shown in Table 4, in each semiconductor layer forming chamber. Then, material gases were fed into the discharge space of each deposited-film-forming chamber through a material gas feed means. Conductance of a conductance valve (not shown) provided between each chamber and a vacuum pump was so adjusted that the pressure in each chamber became the pressure shown in Table 4, using a pressure gauge (not shown) provided at the chamber. Thereafter, a high-frequency (13.56 MHz) power as shown in Table 4 was applied to the cathode electrode of each deposited-film-forming chamber to cause discharge to take place in the discharge space.

Next, the belt-like-substrate 102 was wound off continuously from the wind-off chamber 103, and the n-type layer 905 as a first-conductivity type semiconductor layer, the amorphous i-type layer 906, the microcrystalline i-type layer 907 and the microcrystalline p-type semiconductor layer 908 as a second-conductivity type semiconductor layer were formed continuously in order on the belt-like substrate 102 in the chambers 105, 106, 107 and 108, respectively, to superpose semiconductor layers in the layer thickness as shown in Table 4. Then the substrate with layers thus formed thereon was wound up on the bobbin 112 of the wind-up chamber 104 having a belt-like substrate wind-up mechanism.

Next, on the microcrystalline p-type semiconductor layer 908, ITO ($In_2O_3+SnO_2$) as the transparent conductive layer 909 was deposited in a thickness of 68 nm by sputtering using a different apparatus. Thus the photovoltaic device 901 was produced. The step of forming finally the collector electrode 910 will be described in evaluation methods described later. The chamber 107 was set up to have the following conditions.

Ws=500 mm, h=50 mm, d=20 mm, S=850 mm×450 mm (each value is so set as to satisfy the results of Experiment 2)

Belt-like substrate: SUS4302D, Wk=356 mm, thickness: 0.15 mm

Reflecting layer: Al thin film, thickness: 200 nm

Reflection enhancing layer: ZnO thin film, thickness: 1.2 μm

Transparent conductive layer: ITO thin film, thickness: 68 nm

TABLE 4

| Layer: Layer thickness (Å) | Gases used | Flow rate (sccm) | High-frequency power (W) | Pressure (Torr) | Substrate temp. (° C.) |
|---|---|---|---|---|---|
| Amorphous n-type Si layer: | | | | | |
| 125 | $SiH_4$ | 160 | 160 | 1.00 | 250 |
| | $PH_3/H_2$ ($PH_3$: 2%) | 240 | | | |
| | $H_2$ | 3,000 | | | |
| Amorphous i-type Si layer: | | | | | |
| 1,100 | $SiH_4$ | 350 | 1,400 | 1.10 | 200 |
| | $H_2$ | 6,000 | | | |
| Microcrystalline i-type Si layer: | | | | | |
| 60 | $SiH_4$ | 30 | 1,000 | 1.05 | 210 |
| | $H_2$ | 1,500 | | | |
| Microcrystalline p-type Si layer: | | | | | |
| 80 | $SiH_4$ | 15 | 1,500 | 1.00 | 170 |
| | $BF_3/H_2$ ($BF_3$: 2%) | 110 | | | |
| | $H_2$ | 5,000 | | | |

COMPARATIVE EXAMPLE 1

Three kinds of photovoltaic devices (A–C) were produced as Comparative Example 1 in the same manner as in Example 1 except for the following.

Comparative Example 1-A

A photovoltaic device was produced in the same manner as in Example 1 except that the distance h between the parallel-plate electrode and the belt-like substrate in the chamber 107 for forming the microcrystalline i-type Si layer was changed to 100 mm (Ws/h=5) so as to be:

$(Ws/h) \times 2(Ws-Wk)/[4h+(Ws-Wc)] < 10$, and, in order to keep residence time, the flow rates of the gases used were doubled and the applied RF power was doubled.

Comparative Example 1-B

A photovoltaic device was produced in the same manner as in Example 1 except that only the bottom plate edge area width d of the chamber 107 was set at 50 mm (h/d=1) so as to be h/d <2.5.

Comparative Example 1-C

A photovoltaic device was produced in the same manner as in Example 1 except that only the applied RF power in the chamber 107 for forming the microcrystalline i-type Si layer was changed to 600 W or 800 W so as to be P<(10/8)×Pd×S.

Evaluation

Figure 10:
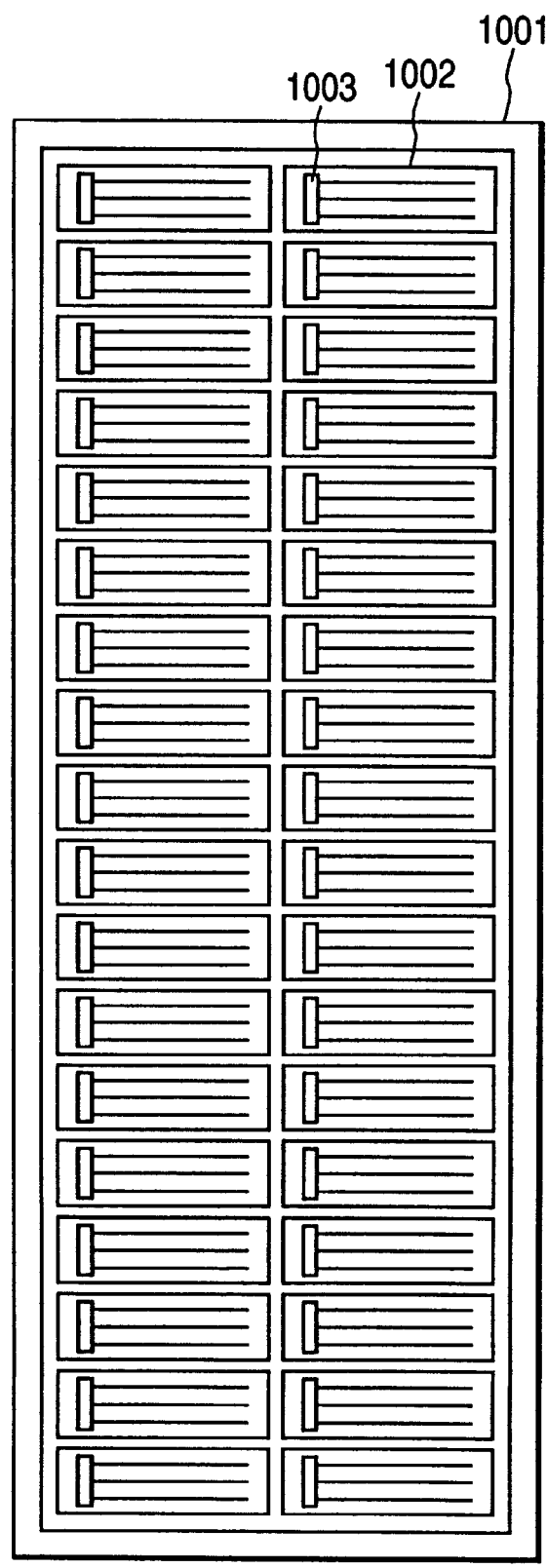
FIG. 10 is a diagrammatic plan view of coupons prepared to make evaluation on the photovoltaic device of Example 1 in the present invention.

Evaluation was made on the photovoltaic devices produced respectively in Example 1 and Comparative Example 1. To make evaluation, two kinds of cell-pattern samples were prepared. One of them is a subdivided sample as shown in FIG. 10, in order to show the characteristics distribution of the photovoltaic devices and is hereinafter called a coupon. The other is a sample not subdivided but provided with a collector electrode formed of a copper wire coated with silver around it and further coated with a carbon paste and having a cell pattern with an area of 356 mm×240 mm and is hereinafter called a large-area cell.

A specific procedure for preparing the coupon is shown below.

The photovoltaic devices produced in Example 1 and Comparative Example 1 were each cut into a piece of 356 mm×120 mm in size. This is hereinafter called a slab.

The slab was put in an aqueous $AlCl_3$ solution electrolytic cell (not shown). The substrate side of the slab was set as the negative pole and the opposing electrode as the positive pole, and a positive voltage of 3.5 V was applied intermittently six times for 1 second for each application, thereby providing electrolytic treatment. The aqueous $AlCl_3$ solution was set to have an electrical conductivity of 68 mS/cm (25° C.), and the area of the opposing electrode was made identical to the slab area. Thereafter, the slab was taken out of the electrolytic cell, and then washed thoroughly with pure water to remove the electrolyte from its surface, followed by drying in a hot-air oven at 150° C. for 30 minutes.

Next, $FeCl_3 \cdot 6H_2O$ was melted by heating, which was used as an etchant base solution, and fine acrylic resin particles 5 μm in particle diameter and glycerol were kneaded into the solution to prepare an etching paste. Using this paste, an etched pattern 1002 as shown in FIG. 10 was printed in a line width of 1 mm on the transparent conductive layer of the slab by means of a screen printer (not shown). The pattern was formed in a layer thickness of 30 μm. Thereafter, in an IR oven (not shown), the slab was heated at a temperature of 170° C. for 5 minutes. After the heating, the slab was taken out of the IR oven and cooled, followed by washing with pure water to remove the paste. Thereafter, the slab was dried in a hot-air oven at 150° C. for 30 minutes; thus the etched pattern 1002 as shown in FIG. 10 was obtained.

Grid electrodes 1003 for collecting electricity were further formed as shown in FIG. 10, by screen printing of silver paste to make up a coupon 1001.

The samples thus obtained were tested with a solar simulator (AM 1.5, 100 mW/cm$^2$) as irradiation light, to measure at 25° C. various characteristic values (open-circuit voltage Voc, short-circuit current density Jsc, fill factor FF and conversion efficiency).

Results obtained are shown dividedly for each of the coupons and large-area cells. With regard to the coupons, the results are shown in Table 5 as a difference between the maximum value and the minimum value [(minimum value−maximum value)/maximum value) (%)] of each characteristic value of the individual sub-cells. With regard to the large-area cells, the results of conversion efficiency are shown in Table 6 as a relative value standardized by regarding the results of Example 1 as 1.

TABLE 5

| | Ws/h | h/d | Applied power (W) | Voc | Jsc | FF | Conversion efficiency |
|---|---|---|---|---|---|---|---|
| Example: | | | | | | | |
| 1 | 10 | 2.5 | 1,000 | −2.2% | −1.8% | −1.7% | −1.8% |
| Comparative Example: | | | | | | | |
| 1-A | 5 | 2.5 | 2,000 | −2.1% | −1.8% | −8.0% | −8.4% |
| 1-B | 10 | 1.0 | 1,000 | −2.1% | −1.8% | −3.2% | −2.8% |
| 1-C | 10 | 2.5 | 600 | −1.4% | −1.8% | −9.0% | −8.1% |
| 1-C | 10 | 2.5 | 800 | −2.0% | −1.8% | −4.0% | −4.1% |

TABLE 6

| | Ws/h | h/d | Applied power (W) | Conversion efficiency |
|---|---|---|---|---|
| Example: | | | | |
| 1 | 10 | 2.5 | 1,000 | 1.00 |
| Comparative Example: | | | | |
| 1-A | 5 | 2.5 | 2,000 | 0.96 |
| 1-B | 10 | 1.0 | 1,000 | 0.98 |
| 1-C | 10 | 2.5 | 600 | 0.97 |
| 1-C | 10 | 2.5 | 800 | 0.97 |

As can be seen from Table 5, with regard to the coupons, the device of Example 1 has a remarkably superior uniformity in conversion efficiency compared with any of those of Comparative Example 1. As can also be seen from Table 6, with regard to the large-area cells, too, the device of Example 1 is superior to any of those of Comparative Example 1, and has achieved uniformity in conversion efficiency at a high level.

EXAMPLE 2

Figure 11:
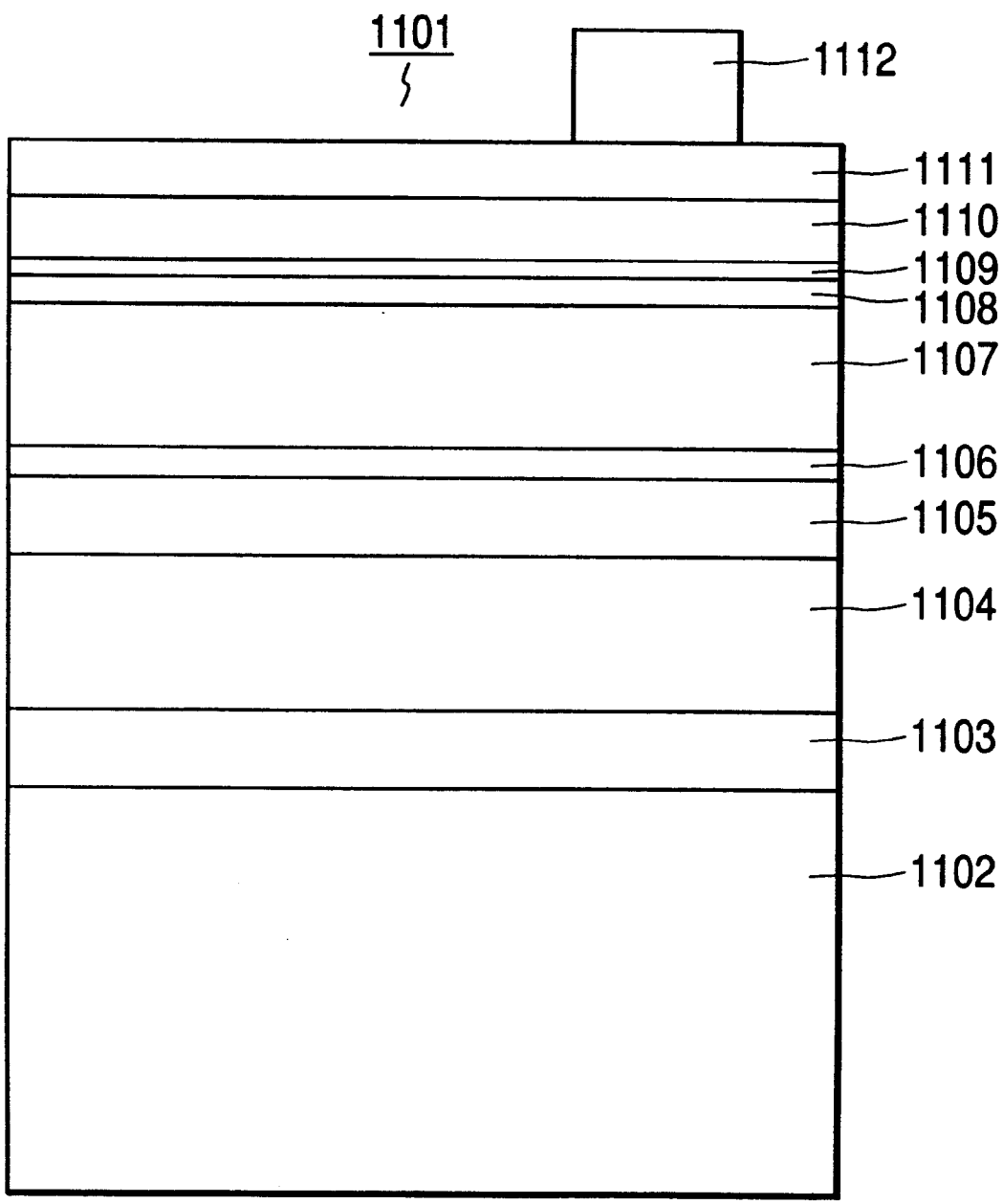
FIG. 11 is a diagrammatic cross-sectional view of the layer configuration of a SiGe single-cell type photovoltaic device of Example 2 in the present invention.

As a second Example of the present invention, a SiGe single-cell type photovoltaic device 1101 having the layer configuration as shown in FIG. 11 was produced. In FIG. 11, reference numeral 1102 denotes a conductive belt-like substrate; 1103, a back surface reflecting layer; 1104, a reflection enhancing layer; 1105, a first-conductivity type semiconductor layer, amorphous n-type Si layer; 1106, an amorphous i-type Si layer; 1107, an amorphous i-type SiGe layer; 1108 an amorphous i-type Si layer; 1109, a microcrystalline i-type Si layer; 1110, a second-conductivity type semiconductor layer, microcrystalline p-type Si layer; 1111, a transparent conductive layer; and 1112, a collector electrode.

The procedure for its production was basically the same as that in Example 1. Under conditions shown in Table 7, used was a single-cell continuous film-forming apparatus of a roll-to-roll system as shown in FIG. 12, having deposited-film-forming chambers corresponding to the respective semiconductor layers.

Figure 12:
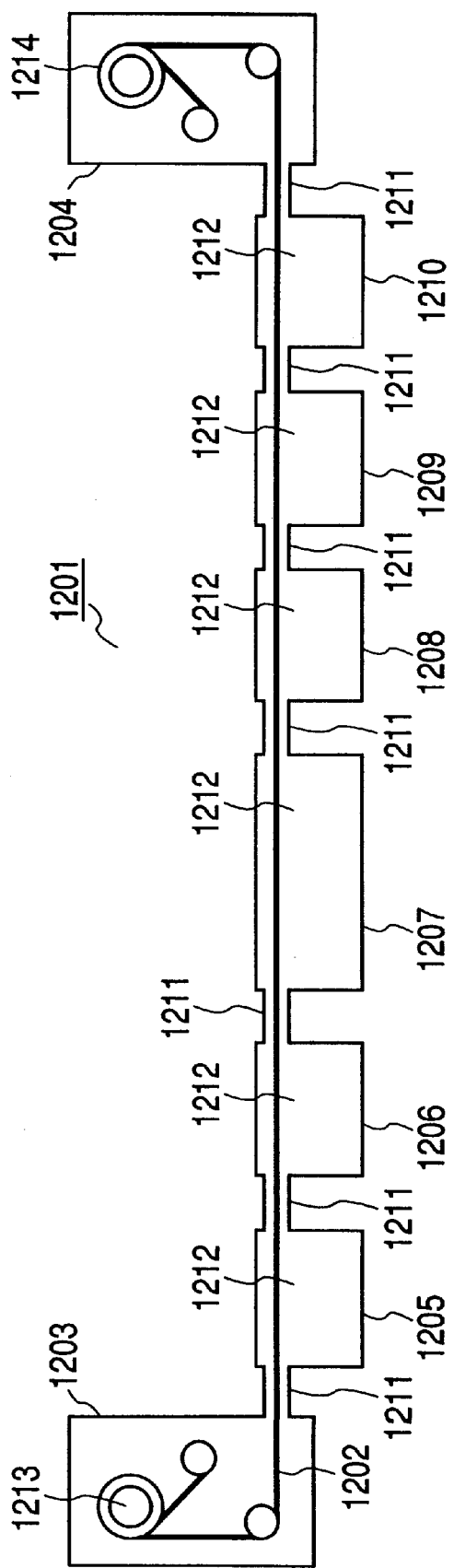
FIG. 12 is a schematic cross-sectional view of a plasma CVD continuous film-forming apparatus of a roll-to-roll system, for forming semiconductor layers of a photovoltaic device of Example 2 in the present invention.

In FIG. 12, reference numeral 1202 denotes a belt-like substrate; 1203, a wind-off chamber for the belt-like substrate 1202; 1204, a wind-up chamber for the belt-like substrate 1202; and 1205 to 1210, semiconductor-layer-forming chambers, in which reference numeral 1205 denotes a chamber for forming the amorphous n-type Si layer 1105; 1206, a chamber for forming the amorphous i-type Si layer 1106; 1207, a chamber for forming the amorphous i-type SiGe layer 1107; 1208, a chamber for forming the amorphous i-type Si layer 1108; 1209, a chamber for forming the microcrystalline i-type Si layer 1109; and 1210, a chamber for forming the microcrystalline p-type Si layer 1110. Also, reference numerals 1212 denote discharge spaces; 1211, gas gates; and 1213 and 1214, bobbins. The respective chambers 1203 to 1210 are connected through the gas gates 1211 so that the discharge spaces are kept independent from one another. The chamber 1207 for forming the amorphous i-type SiGe layer is a chamber for forming deposited films by microwave plasma CVD. The chamber 1209 is set up to have the following conditions.

Ws=500 mm, h=50 mm, d=20 mm, S=850 mm×450 mm (each value is so set as to satisfy the results of Experiment 2)

Belt-like substrate: SUS4302D, Wk=356 mm, thickness: 0.15 mm

Reflecting layer: Al thin film, thickness: 200 nm

Reflection enhancing layer: ZnO thin film, thickness: 1.2 $\mu$m

Transparent conductive layer: ITO thin film, thickness: 68 nm

TABLE 7

| Layer: Layer thickness (Å) | Gases used | Flow rate (sccm) | High-frequency power (W) | Pressure (Torr) | Substrate temp. (° C.) |
|---|---|---|---|---|---|
| Amorphous n-type Si layer: | | | | | |
| 125 | $SiH_4$ | 160 | 160 | 1.00 | 250 |
| | $PH_3/H_2$ ($PH_3$: 2%) | 240 | | | |
| | $H_2$ | 3,000 | | | |
| Amorphous i-type Si layer: | | | | | |
| 100 | $SiH_4$ | 45 | 140 | 1.05 | 270 |
| | $H_2$ | 90 | | | |
| Amorphous i-type SiGe layer: | | | | | |
| 800 | $SiH_4$ | 90 | 400($\mu$w) | 0.01 | 380 |
| | $GeH_4$ | 115 | 1,200 | | |
| | $H_2$ | 600 | | | |
| Amorphous i-type Si layer: | | | | | |
| 110 | $SiH_4$ | 100 | 150 | 1.05 | 300 |
| | $H_2$ | 1,500 | | | |
| Microcrystalline i-type Si layer: | | | | | |
| 60 | $SiH_4$ | 30 | 1,000 | 1.05 | 210 |
| | $H_2$ | 1,500 | | | |
| Microcrystalline p-type Si layer: | | | | | |
| 80 | $SiH_4$ | 18 | 1,200 | 1.00 | 230 |
| | $BF_3/H_2$ ($BF_3$: 2%) | 450 | | | |
| | $H_2$ | 6,000 | | | |

COMPARATIVE EXAMPLE 2

Three kinds of photovoltaic devices (A–C) were produced as Comparative Example 2 in the same manner as in Example 2 except for the following.

Comparative Example 2-A

A photovoltaic device was produced in the same manner as in Example 2 except that the distance h between the parallel-plate electrode and the belt-like substrate in the chamber 1209 for forming the microcrystalline i-type Si layer was changed to 100 mm (Ws/h=5) so as to be:

$(Ws/h) \times 2(Ws-Wk)/[4h+(Ws-Wc)] < 10$, and, in order to keep residence time, the flow rates of the gases used were doubled and the applied RF power was doubled.

Comparative Example 2-B

A photovoltaic device was produced in the same manner as in Example 2 except that only the bottom plate edge area width d of the chamber 1209 for forming the microcrystalline i-type Si layer was set at 50 mm (h/d=1) so as to be h/d<2.5.

Comparative Example 2-C

A photovoltaic device was produced in the same manner as in Example 2 except that only the applied RF power in the chamber 1209 for forming the microcrystalline i-type Si layer was changed to 600 W or 800 W so as to be P<(10/8)×Pd×S.

Evaluation

Evaluation was made on the photovoltaic devices of Example 2 and Comparative Example 2 in the same manner as in Example 1 and Comparative Example 1. Results obtained are shown in Table 8 (coupons) and Table 9 (large-area cells).

TABLE 8

| | Ws/h | h/d | Applied power (W) | Voc | Jsc | FF | Conversion efficiency |
|---|---|---|---|---|---|---|---|
| Example: | | | | | | | |
| 2 | 10 | 2.5 | 1,000 | −2.2% | −3.0% | −2.3% | −2.4% |
| Comparative Example: | | | | | | | |
| 2-A | 5 | 2.5 | 2,000 | −1.0% | −2.9% | −9.5% | −11.8% |
| 2-B | 10 | 1.0 | 1,000 | −1.9% | −3.0% | −3.8% | −4.3% |
| 2-C | 10 | 2.5 | 600 | −1.3% | −3.0% | −8.9% | −10.1% |
| 2-C | 10 | 2.5 | 800 | −1.7% | −2.9% | −4.0% | −5.4% |

TABLE 9

| | Ws/h | h/d | Applied power (W) | Conversion efficiency |
|---|---|---|---|---|
| Example: | | | | |
| 2 | 10 | 2.5 | 1,000 | 1.00 |
| Comparative Example: | | | | |
| 2-A | 5 | 2.5 | 2,000 | 0.95 |
| 2-B | 10 | 1.0 | 1,000 | 0.97 |
| 2-C | 10 | 2.5 | 600 | 0.64 |
| 2-C | 10 | 2.5 | 800 | 0.95 |

As can be seen from Table 8, with regard to the coupons, the device of Example 2 has a remarkably superior uniformity in conversion efficiency compared with any of those of Comparative Example 2. As can also be seen from Table 9, with regard to the large-area cells, too, the device of Example 2 is superior to any of those of Comparative Example 2, and has achieved uniformity in conversion efficiency at a high level.

EXAMPLE 3

Figure 13:
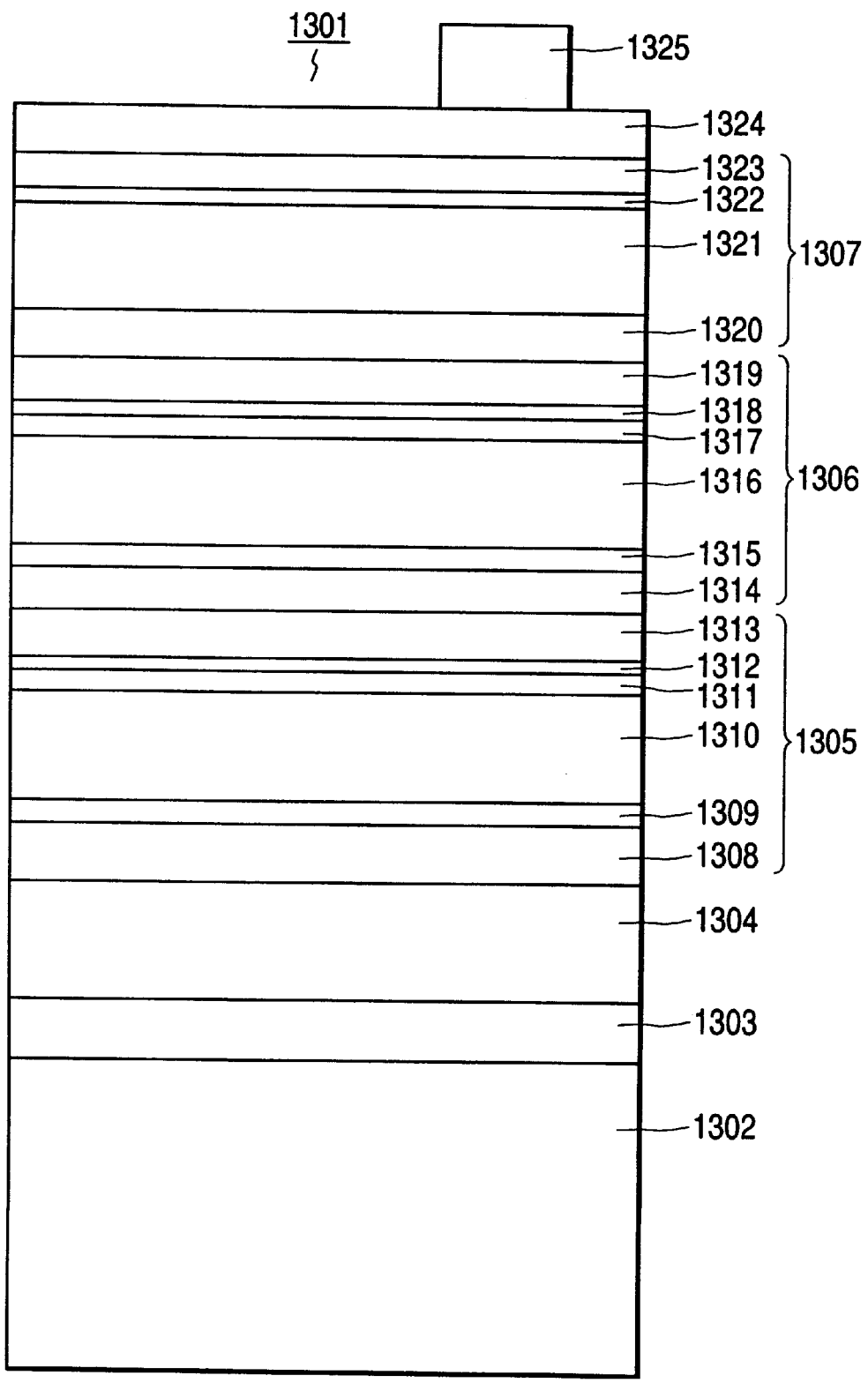
FIG. 13 is a diagrammatic cross-sectional view of the layer configuration of a SiGe/SiGe/Si triple-cell type photovoltaic device of Example 3 in the present invention.

As a third Example of the present invention, a SiGe/SiGe/Si triple-cell type photovoltaic device 1301 having the layer configuration as shown in FIG. 13 was produced.

In FIG. 13, reference numeral 1302 denotes a conductive belt-like substrate; 1303, a back surface reflecting layer; 1304, a reflection enhancing layer; 1305, a bottom SiGe cell, which consists of an amorphous n-type Si layer 1308, an amorphous i-type Si layer 1309, an amorphous i-type SiGe layer 1310, an amorphous i-type Si layer 1311, a microcrystalline i-type Si layer 1312 and a microcrystalline p-type Si layer 1313. Reference numeral 1306 denotes a middle SiGe cell, which consists of an amorphous n-type Si layer 1314, an amorphous i-type Si layer 1315, an amorphous i-type SiGe layer 1316, an amorphous i-type SiGe layer 1317, a microcrystalline i-type Si layer 1318 and a microcrystalline p-type Si layer 1319. Reference numeral 1307 denotes a top Si cell, which consists of an amorphous n-type Si layer 1320, an amorphous i-type Si layer 1321, a microcrystalline i-type Si layer 1322 and a microcrystalline p-type Si layer 1323. A transparent conductive layer 1324 and a collector electrode 1325 are further superposed thereon to make up the cell.

Figure 14:
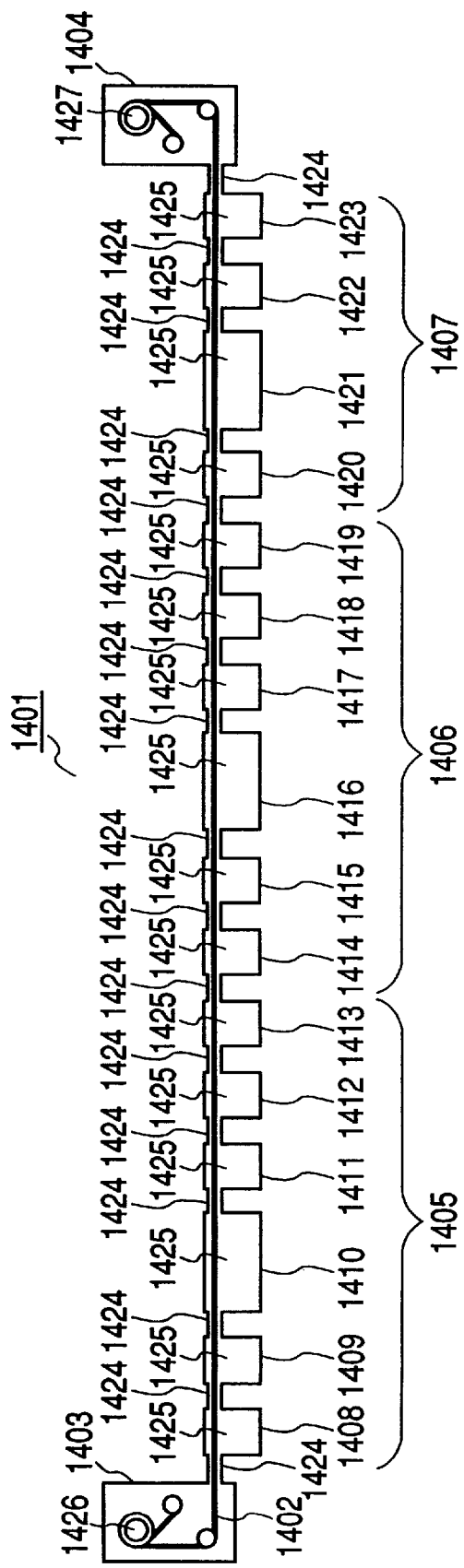
FIG. 14 is a schematic cross-sectional view of a plasma CVD continuous film-forming apparatus of a roll-to-roll system, for forming semiconductor layers of a photovoltaic device of Example 3 in the present invention.

To form the semiconductor layers, used was a plasma CVD triple-cell continuous film-forming apparatus employing a roll-to-roll system as shown in FIG. 14.

In FIG. 14, reference numeral 1402 denotes a belt-like substrate; 1403, a wind-off chamber for the belt-like substrate 1402; 1404, a wind-up chamber; and 1408 to 1423, semiconductor-layer-forming chambers, in which reference numerals 1408, 1414 and 1420 denote chambers for forming the amorphous n-type Si layers 1308, 1314 and 1320, respectively; 1409, 1411, 1415, 1417 and 1421, chambers for forming the amorphous i-type Si layers 1309, 1311, 1315, 1317 and 1321, respectively; 1410 and 1416, chambers for forming the amorphous i-type SiGe layers 1310 and 1316, respectively; 1412, 1418 and 1422, chambers for forming the microcrystalline i-type Si layers 1312, 1318 and 1322, respectively; and 1413, 1419 and 1423, chambers for forming the microcrystalline p-type Si layer 1313, 1319 and 1323, respectively. Also, reference numerals 1405, 1406 and 1407 denote sections for forming the bottom SiGe cell 1305, the middle SiGe cell 1306 and the top Si cell 1307, respectively. Reference numerals 1425 denote discharge spaces; 1424, gas gates; and 1426 and 1427, bobbins.

The procedure for its production was basically the same as that in Example 1. The semiconductor layers were formed under conditions shown in Table 10. The chambers 1412, 1418 and 1422 were set up to have the following conditions:

Ws=500 mm, h=50 mm, d=20 mm, S=850 mm×450 mm (each value is so set as to satisfy the results of Experiment 2)

Belt-like substrate: SUS4302D, Wk=356 mm, thickness: 0.15 mm

Reflecting layer: Al thin film, thickness: 200 nm

Reflection enhancing layer: ZnO thin film, thickness: 1.2 $\mu$m

Transparent conductive layer: ITO thin film, thickness: 68 nm

TABLE 10

| Layer: Layer thickness (Å) | Gases used | Flow rate (sccm) | High-frequency power (W) | Pressure (Torr) | Substrate temp. (° C.) |
|---|---|---|---|---|---|
| Amorphous n-type Si layer: | | | | | |
| 125 | SiH$_4$ | 160 | 160 | 1.00 | 250 |
| | PH$_3$/H$_2$ (PH$_3$: 2%) | 240 | | | |
| | H$_2$ | 3,000 | | | |
| Amorphous i-type Si layer: | | | | | |
| 100 | SiH$_4$ | 45 | 140 | 1.05 | 270 |
| | H$_2$ | 90 | | | |
| Amorphous i-type SiGe layer: | | | | | |
| 800 | SiH$_4$ | 90 | 400($\mu$w) | 0.01 | 380 |
| | GeH$_4$ | 115 | 1,200 | | |
| | H$_2$ | 600 | | | |
| Amorphous i-type Si layer: | | | | | |
| 110 | SiH$_4$ | 100 | 150 | 1.05 | 300 |
| | H$_2$ | 1,500 | | | |

TABLE 10-continued

| Layer: Layer thickness (Å) | Gases used | Flow rate (sccm) | High-frequency power (W) | Pressure (Torr) | Substrate temp. (° C.) |
|---|---|---|---|---|---|
| Microcrystalline i-type Si layer: | | | | | |
| 60 | SiH$_4$<br>H$_2$ | 30<br>1,500 | 1,000 | 1.05 | 210 |
| Microcrystalline p-type Si layer: | | | | | |
| 80 | SiH$_4$<br>BF$_3$/H$_2$<br>(BF$_3$: 2%)<br>H$_2$ | 18<br>450<br><br>6,000 | 1,200 | 1.00 | 230 |
| Amorphous n-type Si layer: | | | | | |
| 125 | SiH$_4$<br>PH$_3$/H$_2$<br>(PH$_3$: 2%)<br>H$_2$ | 160<br>240<br><br>3,000 | 160 | 1.00 | 250 |
| Amorphous i-type Si layer: | | | | | |
| 100 | SiH$_4$<br>H$_2$ | 45<br>90 | 140 | 1.05 | 270 |
| Amorphous i-type SiGe layer: | | | | | |
| 800 | SiH$_4$<br>GeH$_4$<br>H$_2$ | 90<br>115<br>600 | 400($\mu$w)<br>1,200 | 0.01 | 380 |
| Amorphous i-type Si layer: | | | | | |
| 110 | SiH$_4$<br>H$_2$ | 100<br>1,500 | 150 | 1.05 | 300 |
| Microcrystalline i-type Si layer: | | | | | |
| 60 | SiH$_4$<br>H$_2$ | 30<br>1,500 | 1,000 | 1.05 | 210 |
| Microcrystalline p-type Si layer: | | | | | |
| 80 | SiH$_4$<br>BF$_3$/H$_2$<br>(BF$_3$: 2%)<br>H$_2$ | 18<br>450<br><br>6,000 | 1,200 | 1.00 | 230 |
| Amorphous n-type Si layer: | | | | | |
| 125 | SiH$_4$<br>PH$_3$/H$_2$<br>(PH$_3$: 2%)<br>H$_2$ | 160<br>240<br><br>3,000 | 160 | 1.00 | 250 |
| Amorphous i-type Si layer: | | | | | |
| 1,100 | SiH$_4$<br>H$_2$ | 355<br>6,000 | 1,400 | 1.10 | 200 |
| Microcrystalline i-type Si layer: | | | | | |
| 60 | SiH$_4$<br>H$_2$ | 30<br>1,500 | 1,000 | 1.05 | 210 |
| Microcrystalline p-type Si layer: | | | | | |
| 80 | SiH$_4$<br>BF$_3$/H$_2$<br>(BF$_3$: 2%)<br>H$_2$ | 15<br>110<br><br>5,000 | 1,500 | 1.00 | 170 |

COMPARATIVE EXAMPLE 3

Three kinds of photovoltaic devices (A–C) were produced as Comparative Example 3 in the same manner as in Example 3 except for the following.

Comparative Example 3-A

A photovoltaic device was produced in the same manner as in Example 3 except that the distance h between the parallel-plate electrode and the belt-like substrate in each of the chambers 1412, 1418 and 1422 for forming the microcrystalline i-type Si layers was changed to 100 mm (Ws/h=5) so as to be:

$$(Ws/h) \times 2(Ws-Wk)/[4h+(Ws-Wc)] < 10,$$

and, in order to keep residence time, the flow rates of the gases used were doubled and the applied RF power was doubled.

Comparative Example 3-B

A photovoltaic device was produced in the same manner as in Example 3 except that only the bottom plate edge area width d of each of the chambers 1412, 1418 and 1422 was set at 50 mm (h/d=1) so as to be h/d<2.5.

Comparative Example 3-C

A photovoltaic device was produced in the same manner as in Example 3 except that only the applied RF power in the chambers 1412, 1418 and 1422 for forming the microcrystalline i-type Si layers was changed to 600 W or 800 W so as to be P<(10/8)×Pd×S.

Evaluation

Evaluation was made on the photovoltaic devices of Example 3 and Comparative Example 3 in the same manner as in Example 1 and Comparative Example 1. Results obtained are shown in Table 11 (coupons) and Table 12 (large-area cells).

TABLE 11

| | Ws/h | h/d | Applied power (W) | Voc | Jsc | FF | Conversion efficiency |
|---|---|---|---|---|---|---|---|
| Example: | | | | | | | |
| 3 | 10 | 2.5 | 1,000 | −2.0% | −2.6% | −2.7% | −2.6% |
| Comparative Example: | | | | | | | |
| 3-A | 5 | 2.5 | 2,000 | −1.3% | −2.5% | −11.2% | −13.4% |
| 3-B | 10 | 1.0 | 1,000 | −1.8% | −2.5% | −4.9% | −5.6% |
| 3-C | 10 | 2.5 | 600 | −1.2% | −2.7% | −10.9% | −12.1% |
| 3-C | 10 | 2.5 | 800 | −1.6% | −2.6% | −6.5% | −7.1% |

TABLE 12

| | Ws/h | h/d | Applied power (W) | Conversion efficiency |
|---|---|---|---|---|
| Example: | | | | |
| 3 | 10 | 2.5 | 1,000 | 1.00 |
| Comparative Example: | | | | |
| 3-A | 5 | 2.5 | 2,000 | 0.94 |
| 3-B | 10 | 1.0 | 1,000 | 0.98 |
| 3-C | 10 | 2.5 | 600 | 0.96 |
| 3-C | 10 | 2.5 | 800 | 0.97 |

As can be seen from Table 11, with regard to the coupons, the device of Example 3 has a remarkably superior uniformity in conversion efficiency compared with any of those of Comparative Example 3. As can also be seen from Table 12, with regard to the large-area cells, too, the device of Example 3 is superior to any of those of Comparative Example 3, and has achieved uniformity in conversion efficiency at a high level.

As described above, the present invention enables formation of microcrystalline i-type semiconductor layers having uniform characteristics over a large area. Hence, it is possible to prevent large-area photovoltaic devices from having a low photoelectric conversion efficiency at the substrate edge area and to mass-produce uniform and good-quality photovoltaic devices in a good yield.

What is claimed is:

1. A process for producing a photovoltaic device, comprising the step of forming a semiconductor layer comprising a non-single crystal first-conductivity type semiconductor layer, an amorphous i-type semiconductor layer, a microcrystalline i-type semiconductor layer and a microcrystalline second-conductivity type semiconductor layer, on a belt-like substrate while transporting the belt-like substrate continuously in its lengthwise direction;

the step of depositing a microcrystalline i-type semiconductor layer in the above step being the step of introducing a film-forming gas into a discharge space one face of which is formed by the belt-like substrate and simultaneously applying a high-frequency power from a parallel-plate electrode facing the belt-like substrate, to cause plasma to take place in the discharge space to form a deposited film continuously on the surface of the belt-like substrate; and in this step;

where an area of the parallel-plate electrode is represented by S; a width of the discharge space in its direction perpendicular to the transport direction of the belt-like substrate, by Ws; a width of a region formed by the parallel-plate electrode together with its surrounding insulating region, in its direction perpendicular to the transport direction of the belt-like substrate, by Wc; a width of the belt-like substrate in the direction perpendicular to its transport, by Wk; a distance between the parallel-plate electrode and the belt-like substrate, by h; a power density at which crystal fraction begins to saturate at predetermined substrate temperature, material gas flow rate and pressure, by Pd; and the high-frequency power, by P; these being set as follows:

$$2h/(Ws-Wc) \geq 2.5, (Ws/h) \times 2(Ws-Wk)/[4h+(Ws-Wc)] \geq 10, \text{ and } P \geq (10/8) \times Pd \times S.$$

2. The process for producing a photovoltaic device according to claim 1, wherein a value of Wc/h is 10 or more.

3. The process for producing a photovoltaic device according to claim 1, wherein the belt-like substrate is electrically conductive.

* * * * *

UNITED STATES PATENT AND TRADEMARK OFFICE
CERTIFICATE OF CORRECTION

PATENT NO.    : 6,482,668 B2
DATED         : November 19, 2002
INVENTOR(S)   : Naoto Okada et al.

It is certified that error appears in the above-identified patent and that said Letters Patent is hereby corrected as shown below:

Column 1,
Line 25, "studies is" should read -- studies are --.

Column 3,
Line 5, "reduced" should read -- reduced, --.

Column 4,
Lines 58 and 63, "cross section" should read -- cross-section --.

Column 7,
Line 32, "h/d" which" should read -- h/d, which --.

Column 11,
Line 48, "which-is 10/8 time" should read -- which is 10/8 times --.

Column 14,
Line 32, "thus the" should read -- thus, the --; and
Line 46, "value)/maximum" should read -- value)/(maximum --.

Column 21,
Line 23, "step;" should read -- step, --.

Signed and Sealed this

Nineteenth Day of August, 2003

JAMES E. ROGAN
*Director of the United States Patent and Trademark Office*